(12) United States Patent
Matsuoka et al.

(10) Patent No.: US 9,824,738 B2
(45) Date of Patent: Nov. 21, 2017

(54) SEMICONDUCTOR STORAGE DEVICE

(71) Applicant: TOSHIBA MEMORY CORPORATION, Minato-ku, Tokyo (JP)

(72) Inventors: Fumiyoshi Matsuoka, Kawasaki Kanagawa (JP); Tadashi Miyakawa, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/265,776

(22) Filed: Sep. 14, 2016

(65) Prior Publication Data

US 2017/0263298 A1    Sep. 14, 2017

Related U.S. Application Data

(60) Provisional application No. 62/307,242, filed on Mar. 11, 2016.

(51) Int. Cl.
*G11C 11/16* (2006.01)
*G11C 13/00* (2006.01)

(52) U.S. Cl.
CPC ........ *G11C 11/1675* (2013.01); *G11C 11/161* (2013.01); *G11C 11/1655* (2013.01); *G11C 11/1657* (2013.01); *G11C 11/1673* (2013.01); *G11C 13/0069* (2013.01)

(58) Field of Classification Search
CPC .............................. G11C 11/16; G11C 13/0069
USPC .................................................... 365/66, 158
See application file for complete search history.

(56) References Cited

U.S. PATENT DOCUMENTS

| 4,958,377 | A | * | 9/1990 | Takahashi | G11C 15/04 365/49.17 |
|---|---|---|---|---|---|
| 5,625,586 | A | * | 4/1997 | Yamasaki | G11C 11/56 365/104 |
| 6,069,831 | A | * | 5/2000 | Jang | G11C 7/062 365/189.07 |
| 6,288,930 | B1 | * | 9/2001 | Takeshima | G11C 11/22 365/145 |
| 6,388,937 | B2 | * | 5/2002 | Takeyama | G11C 7/1018 365/230.03 |
| 7,490,192 | B2 | * | 2/2009 | Sugimoto | G11C 7/109 711/103 |
| 7,508,725 | B2 | * | 3/2009 | Sugiura | G11C 29/16 365/189.07 |
| 7,808,811 | B2 | * | 10/2010 | Park | G11C 8/08 365/148 |
| 8,085,609 | B2 | * | 12/2011 | Shinoda | G11C 29/02 365/185.23 |

(Continued)

FOREIGN PATENT DOCUMENTS

| JP | 2003249629 A | 9/2003 |
|---|---|---|
| JP | 2007242217 A | 9/2007 |

*Primary Examiner* — Michael Tran
(74) *Attorney, Agent, or Firm* — Holtz, Holtz & Volek PC

(57) ABSTRACT

According to one embodiment, a semiconductor storage device includes a first memory area, a first selection circuit for selecting a bit line of the first memory area, a second memory area, a second selection circuit for selecting a bit line of the second memory area, and a third selection circuit arranged between the first selection circuit and the second selection circuit and configured to select either the first selection circuit or the second selection circuit.

18 Claims, 13 Drawing Sheets

(56) References Cited

U.S. PATENT DOCUMENTS

| | | | | |
|---|---|---|---|---|
| 8,400,855 B2* | 3/2013 | Nakagawa | ............ | G11C 7/1048 365/203 |
| 8,451,645 B2* | 5/2013 | Yoon | ........................ | G11C 11/16 365/148 |
| 8,773,887 B1* | 7/2014 | Naji | ........................ | G11C 11/165 365/148 |
| 8,788,893 B2* | 7/2014 | Kim | ........................ | G11C 29/46 365/201 |
| 8,812,810 B2* | 8/2014 | Yoshida | .............. | G06F 12/0684 711/170 |
| 8,971,115 B2* | 3/2015 | Hosono | .................. | G11C 16/24 365/185.11 |
| 8,976,577 B2* | 3/2015 | Agan | .................... | G11C 11/161 365/148 |
| 8,976,590 B2* | 3/2015 | Takeuchi | ................ | G11C 16/10 365/185.03 |
| 9,190,146 B2* | 11/2015 | Toda | .................... | G11C 13/0069 |
| 9,196,317 B2* | 11/2015 | Aritome | ................ | G11C 5/063 |
| 9,368,199 B2 | 6/2016 | Miyakawa et al. | | |
| 9,379,715 B2* | 6/2016 | Jeong | ........................ | H03L 7/00 |
| 2010/0054072 A1* | 3/2010 | Stansfield | .............. | G11C 8/14 365/230.03 |
| 2010/0265778 A1* | 10/2010 | Yasuda | .................... | G11C 7/08 365/194 |
| 2010/0328985 A1* | 12/2010 | Miura | .................... | G11C 5/025 365/72 |
| 2011/0026292 A1 | 2/2011 | Narui | | |
| 2011/0149629 A1* | 6/2011 | Shim | ........................ | G11C 7/18 365/63 |
| 2011/0199817 A1* | 8/2011 | Joshi | ........................ | G11C 7/12 365/156 |
| 2011/0261614 A1* | 10/2011 | Tsukada | ............. | G11C 13/0004 365/163 |
| 2011/0310675 A1* | 12/2011 | Nobunaga | .............. | G11C 16/26 365/185.25 |
| 2012/0307545 A1* | 12/2012 | McAdams | ............ | G11C 11/221 365/145 |
| 2013/0294168 A1* | 11/2013 | Shirakawa | ....... | G11C 29/50004 365/185.17 |
| 2014/0104948 A1* | 4/2014 | Rhie | ........................ | G11C 8/08 365/185.11 |
| 2015/0262623 A1* | 9/2015 | Matsuoka | ........... | G11C 11/1655 365/72 |
| 2016/0012891 A1* | 1/2016 | Intrater | .............. | G11C 13/0069 365/148 |

\* cited by examiner

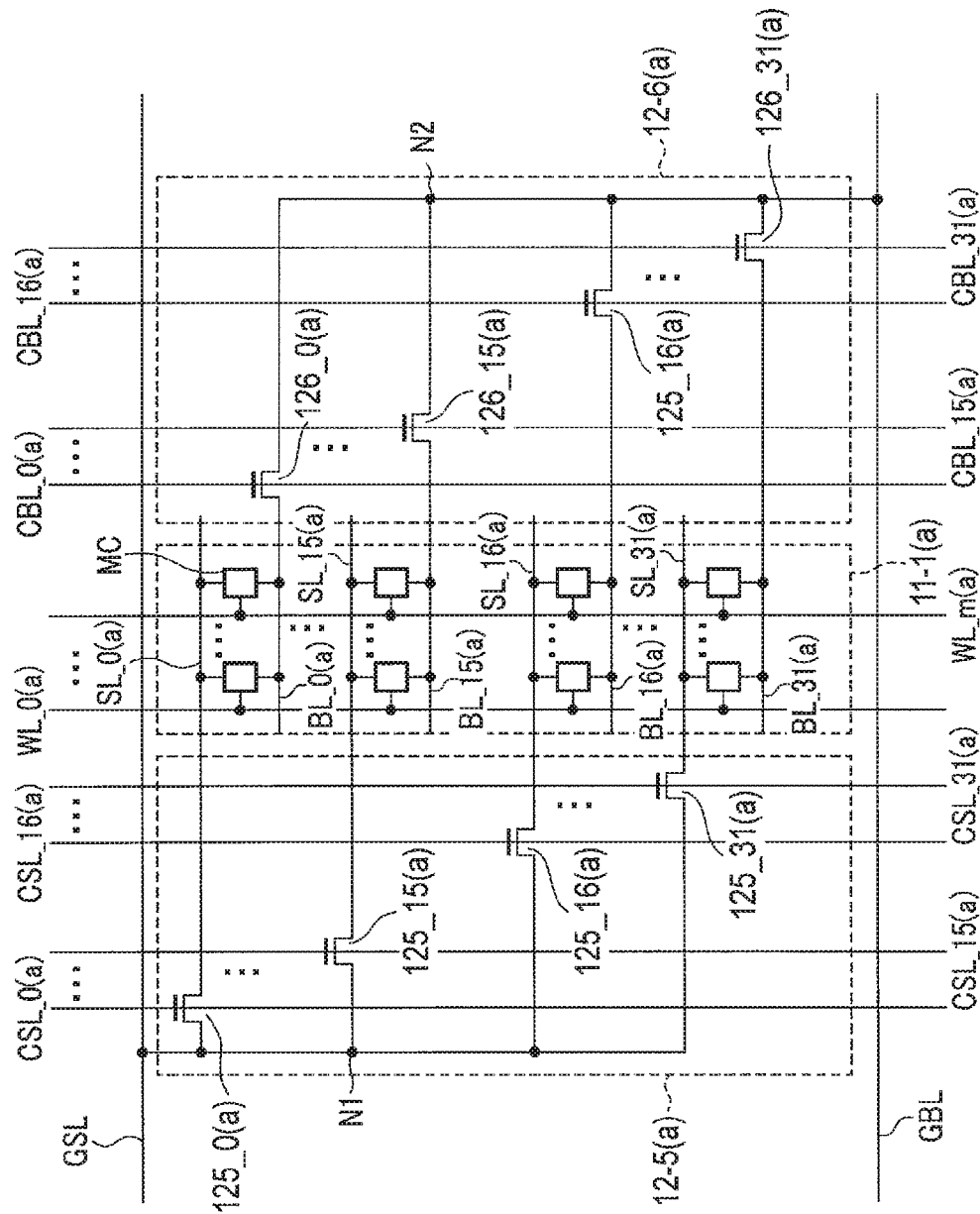
F I G. 8

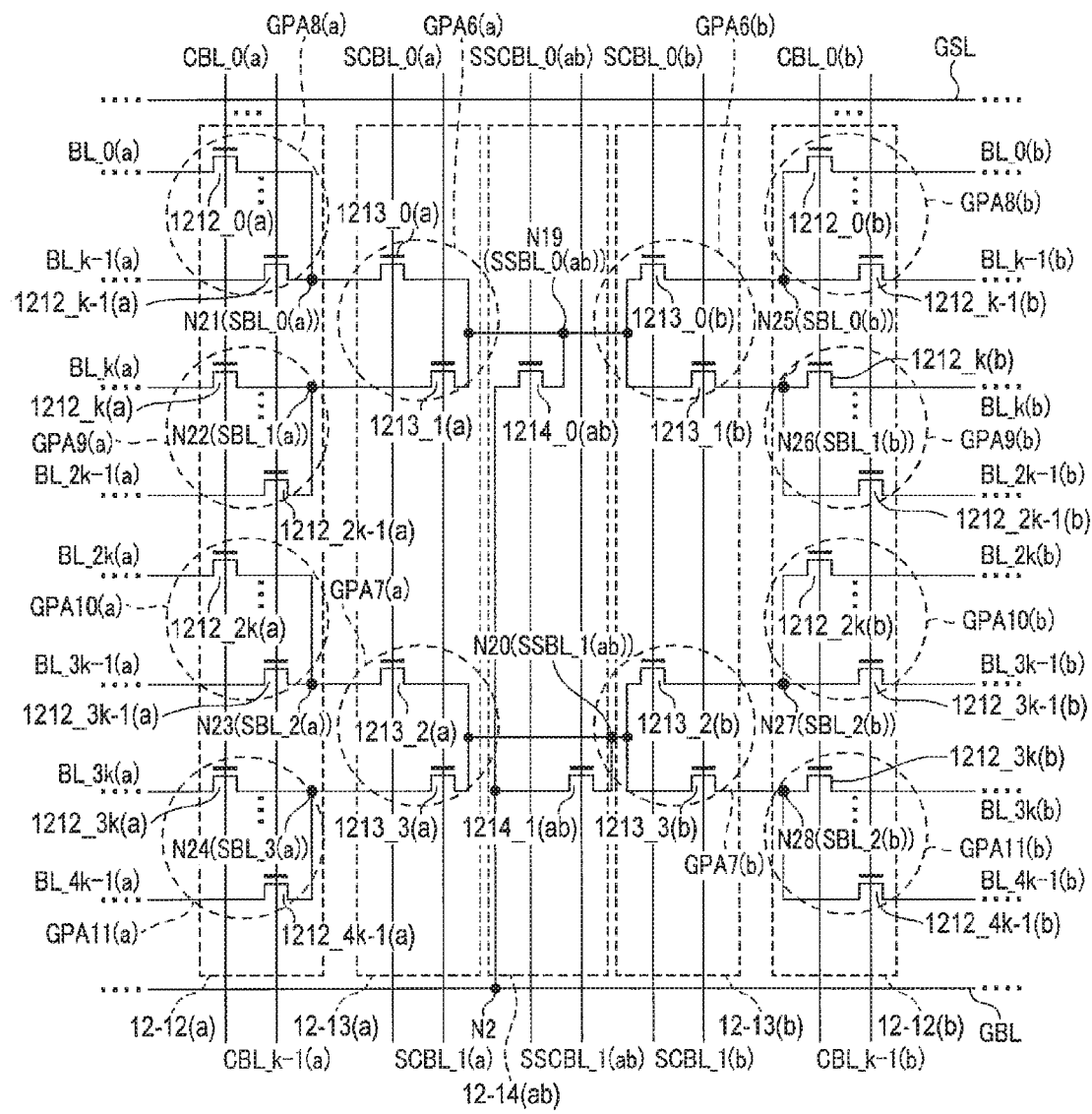
F I G. 13

SEMICONDUCTOR STORAGE DEVICE

CROSS-REFERENCE TO RELATED APPLICATIONS

This application claims the benefit of U.S. Provisional Application No. 62/307,242, filed Mar. 11, 2016, the entire contents of which are incorporated herein by reference.

FIELD

Embodiments described herein relate generally to a semiconductor storage device.

BACKGROUND

A magnetic random access memory (MRAM) is a memory device employing a magnetic element having a magnetoresistive effect as a memory cell for storing information, and receives attention as a next-generation memory device characterized by its high-speed operation, large storage capacity, and non-volatility. Research and development have been conducted to use the MRAM as a replacement for a volatile memory, such as a DRAM or SRAM. In order to lower the development cost and enable smooth replacement, it is desirable to operate the MRAM on the same specifications as the DRAM and SRAM.

BRIEF DESCRIPTION OF THE DRAWINGS

FIG. 8 is a specific circuit diagram illustrating the column selection circuit of the semiconductor storage device of comparative example 1 of the first embodiment.

FIG. 13 is a specific circuit diagram illustrating the column selection circuit of the semiconductor storage device of the second embodiment.

DETAILED DESCRIPTION

In general, according to one embodiment, a semiconductor storage device includes a first memory area, a first selection circuit for selecting a bit line of the first memory area, a second memory area, a second selection circuit for selecting a bit line of the second memory area, and a third selection circuit arranged between the first selection circuit and the second selection circuit and configured to select either the first selection circuit or the second selection circuit.

Hereinafter, embodiments will be described with reference to the accompanying drawings. In the description below, structural elements having the same functions and configurations will be denoted by the same reference symbols. Each of the embodiments described below merely indicates an exemplary apparatus and method for implementing the technical idea of the embodiment. The element materials, shapes, structures, arrangements etc. described in connection with the technical idea of each embodiment are not limited to the ones described below. The technical idea of each embodiment may be modified in various manners within the scope of the claims.

<1> First Embodiment

<1-1> Configuration

<1-1-1> Configuration of Semiconductor Storage Device of First Embodiment

Figure 1:
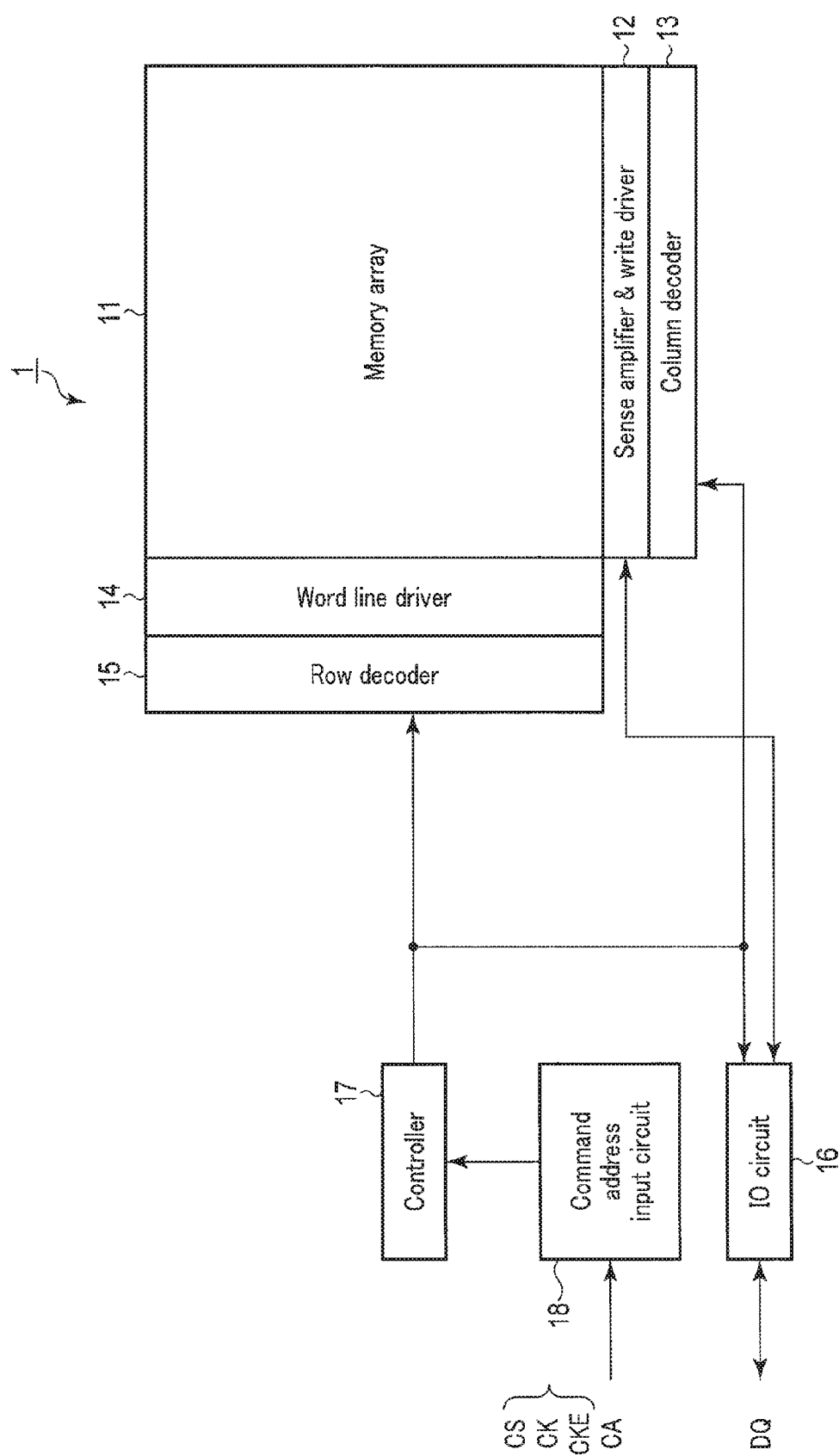
FIG. 1 is a block diagram illustrating an architecture of a semiconductor storage device according to the first embodiment.

A schematic description will be given, with reference to FIG. 1, of the basic configuration of a semiconductor storage device according to the first embodiment.

The semiconductor storage device 1 of the first embodiment comprises a memory array 11, a sense amplifier/write driver 12, a column decoder 13, a word line driver 14, a row decoder 15, an IO circuit 16, a controller 17, and a command address circuit 18.

From a host device (an external device), the command address circuit 18 receives various external control signals, including a chip select signal CS, a clock signal CK, a clock enable signal CKE, and a command address signal CA. The command address circuit 18 transfers the command address signal CA to the controller 17.

The controller 17 discriminates addresses and commands from each other. The controller 17 controls the semiconductor storage device 1.

The memory cell array 11 is an MRAM comprising a plurality of memory cells MC arranged in a two-dimensional matrix pattern. Each memory cell MC includes a magnetic tunnel junction (MTJ) element 22 (not shown) and a cell transistor 23 (not shown). The MTJ element is a magnetic tunnel junction element which stores data by utilization of resistance state changes and enables data to be rewritten in response to a current supplied thereto. A cell transistor 23 is provided in correspondence to the MTJ element 22 and is configured to be set in a conductive state when a current is supplied to the corresponding MTJ element 22.

Word lines WL extending in the row direction and bit lines BL extending in the column direction intersect each other. The adjacent two bit lines BL form a pair, and a memory cell MC is provided at the intersection between word line WL and bit line pair (in the present embodiment, the bit line pair will be referred to as bit line BL and source line SL for descriptive purposes). In each memory cell MC, the MJ element 22 and the cell transistor 23 are connected in series with each other and are interposed between bit line BL and source line SL (between the bit line pair). The gate of the cell transistor 23 is connected to word line WL.

The word line driver 14 is arranged at least along one side of memory cell array 11. The word line driver 14 is configured to apply a voltage to selection word line WL when a data read or data write is performed.

The row decoder 15 decodes the address of the command address signal CA supplied from the command address circuit 18. To be more specific, the row decoder 15 supplies the decoded row address to the word line driver 14. As a result, the word line driver 14 can apply a voltage to the selection word lines WL.

The column decoder 13 identifies a command or an address designated by the command address signal CA, based on an external control signal, and controls the selection of bit line BL and source line SL.

The sense amplifier/write driver 12 includes a sense amplifier and a write driver. The sense amplifier/write driver 12 is arranged at least along one side of memory cell array 11. The sense amplifier is connected to bit lines BL by way of global bit line GBL, and detects a current flowing through a memory cell MC connected to a selected word line WL to read data stored in the memory cell MC. The write driver is connected to the bit lines BL by way of global bit line GBL and to source lines SL by way of global source line GSL, and supplies a current to a memory cell MC connected to a selected word line WL to write data in the memory cell MC.

The sense amplifier/write driver 12 includes a page buffer, not shown. The page buffer stores cell data read by the sense amplifier, or stores write data received by the IO circuit 16 and transferred by way of the data bus.

The data exchange between the sense amplifier/write driver 12 and an external input/output terminal DQ is performed through the data bus and the IO circuit 16.

The memory array 11, sense amplifier/write driver 12, column decoder 13, word line driver 14, and row decoder 15 may be configured as a bank. The semiconductor storage device 1 may be configured to include a plurality of banks.

<1-1-2> Configuration of Memory Cell MC

Figure 2:
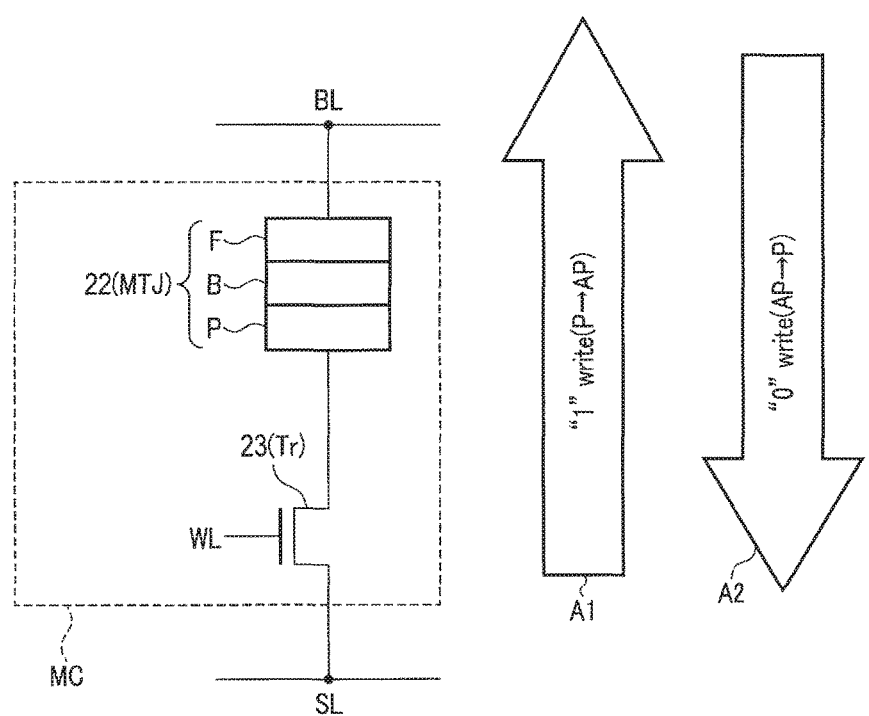
FIG. 2 illustrates a memory cell of the semiconductor storage device of the first embodiment.

Next, a schematic description will be given of a configuration of memory cell MC of the first embodiment with reference to FIG. 2. As shown in FIG. 2, one end of the MTJ element 22 of the memory cell MC of the first embodiment is connected to bit line BL, and the other end of the MTJ element 22 is connected to one end of the cell transistor 23. The other end of the cell transistor 23 is connected to source line SL. The MTJ element 22 utilizing the tunneling magnetoresistive (TMR) effect has a stack structure comprising two ferromagnetic layers F and P and a non-magnetic layer (a tunnel insulation film) B sandwiched between the ferromagnetic layers F and P. The MTJ element 22 stores digital data by utilization of variations in the magnetic resistance caused by a spin-polarized tunneling effect. The MTJ element 22 can be set in a low-resistance state or a high-resistance state in accordance with the magnetic orientations of the two ferromagnetic layers F and P. For example, if the low-resistance state is defined as data "0" and the high-resistance state is defined as data "1", 1-bit data can be recorded in the MTJ element 22. Needless to say, the low-resistance state may be defined as data "1" and the high-resistance state may be defined as data "0".

The MTJ element 22 is formed, for example, by sequentially stacking a fixed layer (pin layer) P, a tunnel barrier layer B, and a storage layer (free layer) F. The pin layer P and the free layer F are made of a ferromagnetic material, and the tunnel barrier layer B is an insulating film (such as $Al_2O_3$ or MgO). The pin layer P is a layer in which the magnetic orientation is fixed, while the free layer F is a layer in which the magnetic orientation is variable and which stores data utilizing the magnetic orientation.

When a current flows in the direction of arrow A1 in a write operation, the magnetic orientation of the free layer F becomes anti-parallel (AP state) with respect to the magnetic orientation of the pin layer P. As a result, a high-resistance state (data "1") is established. When a current flows in the direction of arrow A2 in a write operation, the magnetic orientation of the free layer F becomes parallel (P state) with respect to the magnetic orientation of the pin layer P. As a result, a low-resistance state (data "0") is established. In this manner, different data can be written in the MTJ element depending on the direction in which a current flows.

<1-1-3> Configuration of Memory Cell Array

Figure 3:
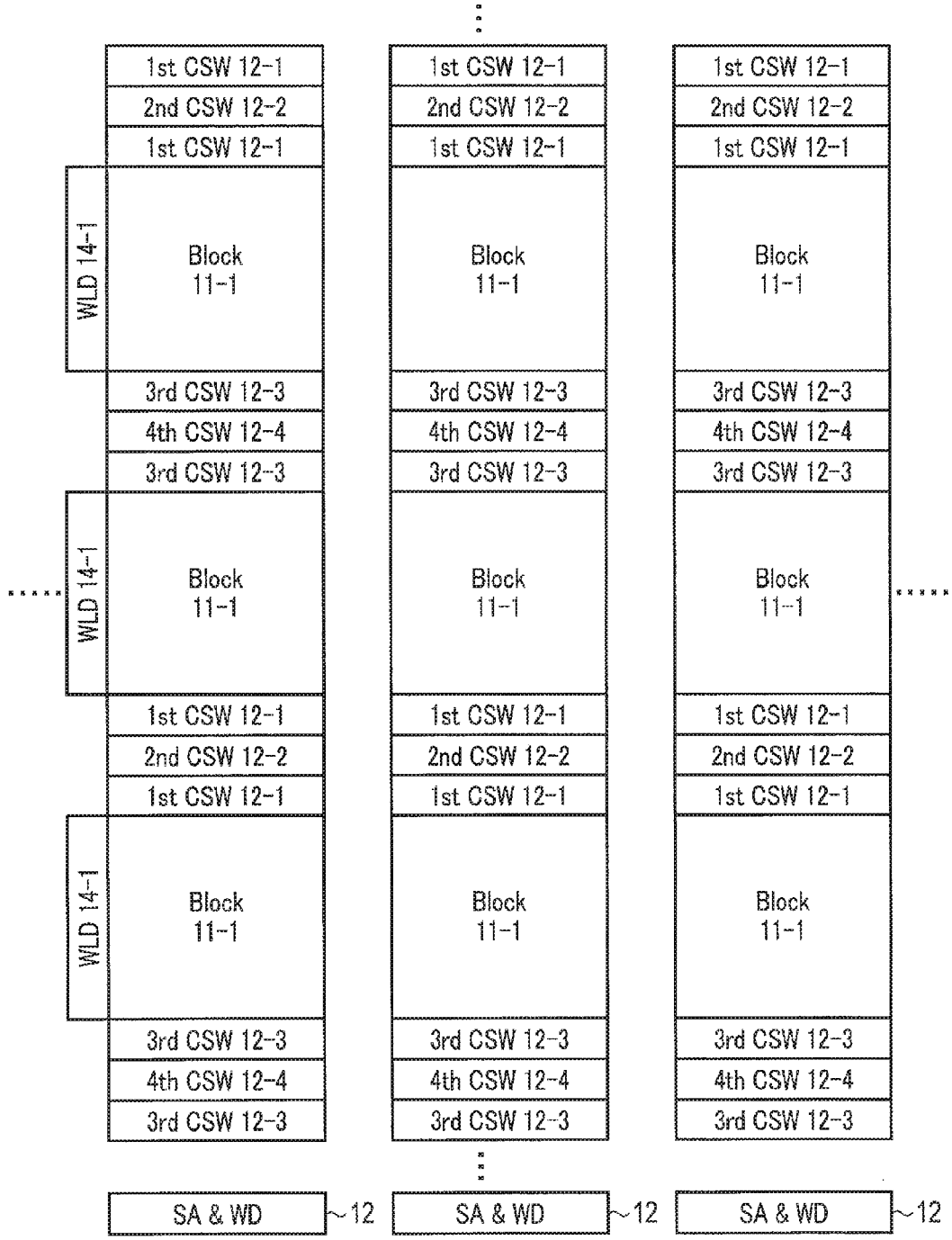
FIG. 3 illustrates a memory cell array of the semiconductor storage device of the first embodiment.

A description will be given of the configuration of the memory cell array 11 of the embodiment with reference to FIG. 3.

Memory array 11 of the present embodiment is divided into a number of blocks 11-1. Each block 11-1 is provided with a plurality of memory cells MC. The blocks 11-1 are arranged in an X direction and a Y direction (i.e., a direction perpendicular to the X direction) in a matrix pattern. Word lines WL extend in the X direction, and global bit line GBL and global source line GSL extend in the Y direction.

A word line driver 14-1 is provided at one end of each block 11-1, as viewed in the X direction. The word line driver 14-1 is used for controlling a number of blocks 11-1. To be more specific, the word line driver 14-1 selects a word line WL, based on a signal supplied from the row decoder 15.

A first column selection circuit 12-1 and a third column selection circuit 12-3 are provided at the respective ends of each block 11-1, as viewed in the Y direction. The first column selection circuit 12-1 is connected to global bit line GBL by way of a second column selection circuit 12-2. The second column selection circuit 12-2 is located between the first column selection circuits 12-1 of the two blocks adjacent in the Y direction. The third column selection circuit 12-3 is connected to global source line GSL by way of a fourth column selection circuit 12-4. The first column selection circuit 12-1 to the fourth column selection circuit 12-4 are used for controlling the respective blocks 11-1. The fourth column selection circuit 12-4 is located between the third column selection circuits 12-3 of the two blocks adjacent in the Y direction.

The column selection circuits for controlling the connection between the bit line BL and global bit line GBL of block 11-1 are configured as two-circuit configurations, namely, the first column selection circuit 12-1 and the second column selection circuit 12-2. The first column selection circuit 12-1 is a circuit for selecting (two or more) bit lines BL of blocks 11-1. The second column selection circuit 12-2 is a circuit for selecting a group of transistors of the first column selection circuit 12-1. The second column selection circuit 12-2 is used when either one of the two blocks 11-1 adjacent in the Y direction is selected.

The column selection circuits for controlling the—connection between the source line SL and global source line GSL of block 11-1 are configured as two-circuit configurations, namely, the third column selection circuit 12-3 and the fourth column selection circuit 12-4. The third column selection circuit 12-3 is a circuit for selecting (two or more) source lines SL of blocks 11-1. The fourth column selection circuit 12-4 is a circuit for selecting a group of transistors of the third column selection circuit 12-3. The fourth column selection circuit 12-4 is used when either one of the two blocks 11-1 adjacent in the Y direction is selected.

The first column selection circuit 12-1 is provided with a plurality of switch transistors, and controls the connection between line SBL and bit line BL, based on control signal line CBL supplied from the column decoder 13.

The second column selection circuit 12-2 is provided with a plurality of switch transistors, and controls the connection between line SBL and global bit line GBL, based on control signal line SCBL supplied from the column decoder 13.

The third column selection circuit 12-3 is provided with a plurality of switch transistors, and controls the connection between line SSL and source line SL, based on control signal line CSL supplied from the column decoder 13.

The fourth column selection circuit 12-4 is provided with a plurality of switch transistors, and controls the connection between line SSL and global source line GSL, based on control signal line SCSL supplied from the column decoder 13.

Where the first column selection circuit 12-1 to the fourth column selection circuit 12-4 perform a selection operation (also referred to as a connection operation), they may be called as being in an "operating state." The selection operation is intended to mean that bit line BL and global bit line GBL are electrically connected to each other or source line SL and global source line GSL are electrically connected to each other. Where the first column selection circuit 12-1 to the fourth column selection circuit 12-4 perform a non-selection operation (also referred to as a non-connection operation), they may be called as being in a "rest state." The non-selection operation is intended to mean that bit line BL and global bit line GBL are not electrically connected to each other or source line SL and global source line GSL are not electrically connected to each other.

<1-1-4> Relationships Between First Column Selection Circuit 12-1 to Fourth Column Selection Circuit 12-4 and Blocks 11-1

Specific examples of the first column selection circuit 12-1 to the fourth column selection circuit 12-4 and specific examples of blocks 11-1 will be described with reference to FIG. 4.

Figure 4:
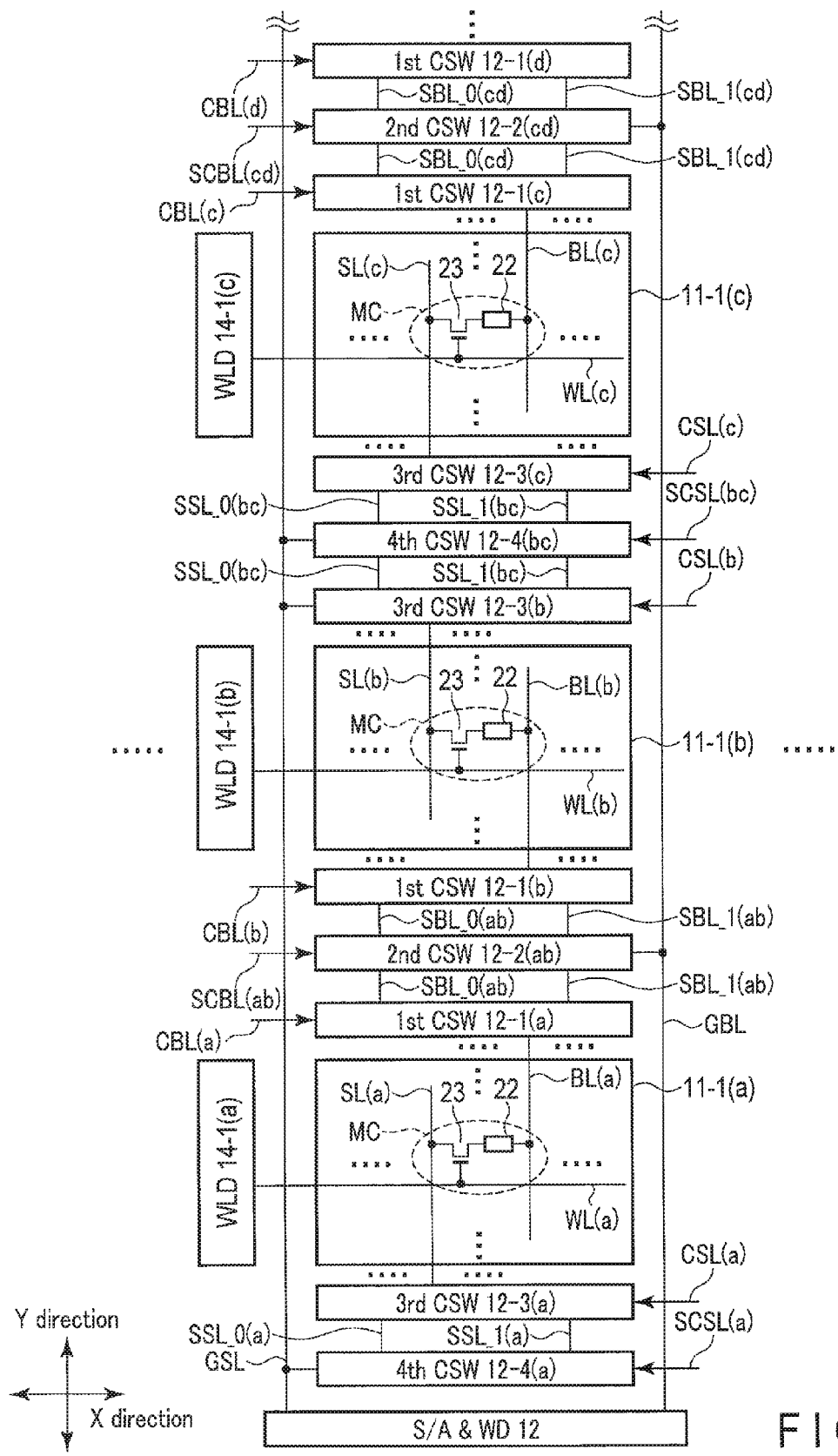
FIG. 4 illustrates a connection between a column selection circuit and blocks of the semiconductor storage device of the first embodiment.

FIG. 4 illustrates block 11-1(a) to block 11-1(c) and the related first to fourth column selection circuits 12-1 to 12-4.

In the drawings, a structural element labeled with "(x)" (x: an English letter) is an element related to block 11-1(x). A structural element labeled with "(xy)" (y: an English letter) is an element related to both block 11-1(x) and block 11-1(y). This applies to the other Figures. For simplicity, the label (x) or label (xy) may be omitted in the specification. Where the label (x) or label (xy) are omitted, the structural element in question is intended to cover both an element labeled with (x) and an element labeled with (xy).

As shown in FIG. 4, block 11-1(a) is arranged close to the sense amplifier/write driver 12. Block 11-1(b) is adjacent to block 11-1(a) in the Y direction. Block 11-1(c) is adjacent to block 11-1(b) in the Y direction.

In the present embodiment, each of the second column selection circuit 12-2 and fourth column selection circuit 12-4 includes two switch transistors (not shown).

As shown in FIG. 4, the second column selection circuit 12-2 controls the connection between line SBL_0 or line SBL_1 and global bit line GBL, based on control signal lines SCBL (SCBL_0 and SCBL_1) supplied from the column decoder 13. The fourth column selection circuit 12-4 controls the connection between line SSL_0 or line SSL_1 and global source line GSL, based on control signal lines SCSL (SCSL_0 and SCSL_1) supplied from the column decoder 13.

In the drawings, the label "_v" (v: an integer) is used to discriminate elements which are denoted by reference symbols including the same symbols and which have similar configurations. Where elements denoted by reference symbols including the same symbols need not be discriminated from each other, they will not be labeled with "_v". For example, where elements denoted by reference symbols "SSL_0" and "SSL_1" need not be discriminated from each other, they will be collectively referred to by "SSL". This applies to the other structural elements as well. Where a plurality of control signal lines are collectively referred to, they will be mentioned without the label "_v". A plurality of control signal lines may be referred to as a "control signal line set" or the like.

As shown in FIG. 4, the fourth column selection circuit 12-4, which is provided at a Y-direction end of memory cell array 11 and related to block 11-1(a), is used for selecting one block 11-1(a). This is because block 11-1(a) is located at the end, and no other block 11-1 is present in the direction toward the sense amplifier/write driver 12.

Although not shown, the second column selection circuit 12-2, which is provided at the other Y-direction end of memory cell array 11 (i.e., the end far from the sense amplifier/write driver circuit 12) and related to block 11-1, is used for selecting one block 11-1.

As shown in FIG. 4, the elements arranged in the Y direction from the sense amplifier/write driver 12 are: fourth column selection circuit 12-4(a), third column selection circuit 12-3(a), block 11-1(a), first column selection circuit 12-1(a), second column selection circuit 12-2(ab), first column selection circuit 12-1(b) . . . . In this arrangement, the position of fourth column selection circuit 12-4 and third column selection circuit 12-3 and the position of first column selection circuit 12-1 and second column selection circuit 12-2 may be interchanged. To be specific, the elements arranged in the Y direction from the sense amplifier/write driver 12 may be: second column selection circuit 12-2(a), first column selection circuit 12-1(a), block 11-1(a), third column selection circuit 12-3(a), fourth column selection circuit 12-4(ab), third column selection circuit 12-3(b) . . . .

<1-1-5> Circuit Configurations of First Column Selection Circuit 12-1 to Fourth Column Section Circuit 12-4

Figure 5:
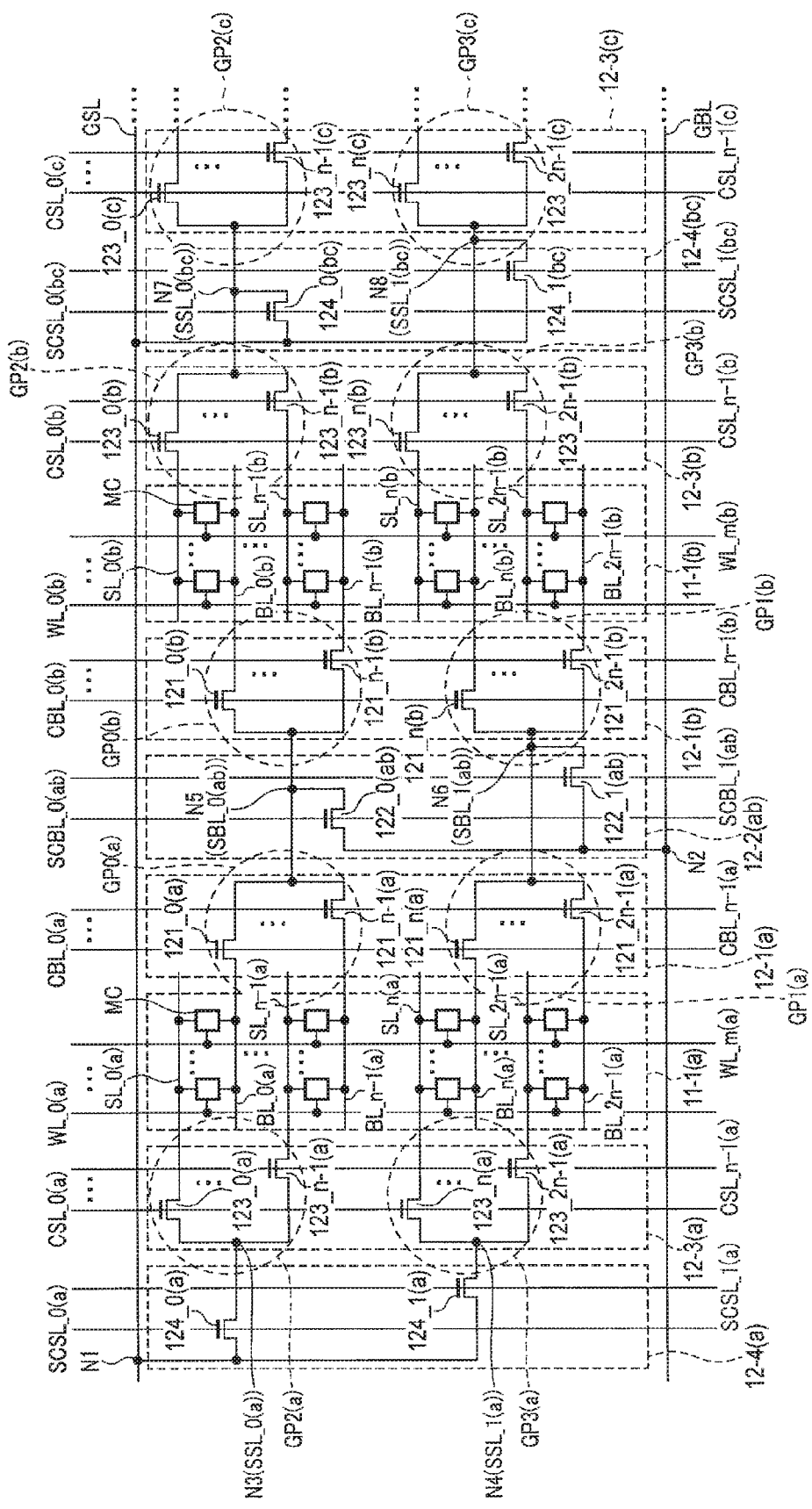
FIG. 5 is a specific circuit diagram illustrating the column selection circuit of the semiconductor storage device of the first embodiment.

Specific circuit configurations of the first column selection circuit 12-1 to fourth column selection circuit 12-4 will be described with reference to FIG. 5.

The second column selection circuit 12-2 comprises NMOS transistor 122_0 and NMOS transistor 122_1. When control signal line SCBL_0 is at the "H (High)" level, NMOS transistor 122_0 electrically connects global bit line GBL (node N2) and line SBL_0 (node N5). When control signal line SCBL_1 is at the "H" level, NMOS transistor 122_1 electrically connects global bit line GBL (node N2) and line SBL_1 (node N6).

The "H" level is a voltage level that turns on an NMOS transistor. The ON state is a state in which the source and drain of a transistor are electrically connected to each other by a channel. The OFF state is a state in which the source and drain of a transistor are not electrically connected to each other. A leak current or the like may flow between the source and the drain even in the OFF state, but such a state will be regarded as the OFF state, not the ON state.

The first column selection circuit 12-1 comprises NMOS transistor 121_0 to NMOS transistor 121_$n$−1 (n: an integer) whose drain or source terminals are connected to line SBL_0 (node N5), and NMOS transistor 121_$n$ to NMOS transistor 121_$2n$−1 whose drain or source terminals are connected to line SBL_1 (node N6). The group of NMOS transistors whose drain or source terminals are connected to line SBL_0 (node N5) will be labelled as group GP0, and the group of NMOS transistors whose drain or source terminals are connected to line SBL_1 (node N6) will be labelled as group GP1.

The control gate electrodes of NMOS transistor 121_0 to NMOS transistor 121_$n$−1 are coupled with control signal lines CBL_0 to CBL_n−1, respectively.

When control signal line CBL_0 is at the "H" level, NMOS transistor 121_0 electrically connects line SBL_0 (node N5) and bit line BL_0. Likewise, when control signal line CBL_1 to control signal line CBL_n−1 are at the "H" level, NMOS transistor 121_1 to NMOS transistor 121_$n$−1 electrically connect line SBL_0 (node N5) and bit lines BL_1 to BL_n−1, respectively.

The control gate electrodes of NMOS transistor 121_$n$ to NMOS transistor 121_$2n$−1 are coupled with control signal line CBL_0 to control signal line CBL_n−1, respectively. When control signal line CBL_0 to control signal line CBL_n−1 are at the "H" level, NMOS transistor 121_$n$ to NMOS transistor 121_$2n$−1 electrically connect line SBL_1 (node N6) and bit lines BL_n to BL_$2n$−1, respectively.

The lines of control signal line CBL_0 to control signal line CBL_n−1 extend in the X direction and are arranged in parallel to one another without any intersection. Control signal line CBL_0 to control signal line CBL_n−1 are coupled to each of group GP0 and group GP1. That is, one transistor of group GP0 and one transistor of group GP1 can be controlled using single control signal line CBL. For this reason, in the first column selection circuit 12-1, two columns of transistor groups (n transistors) are arranged in the X direction.

The fourth column selection circuit 12-4 comprises NMOS transistor 124_0 and NMOS transistor 124_1. When control signal line SCSL_0 is at the "H" level, NMOS transistor 124_0 electrically connects global source line GSL (node N1) and line SSL_0 (node N3). When control signal line SCSL_1 is at the "H" level, NMOS transistor 124_1 electrically connects global source line GSL (node N1) and line SSL_1 (node N4).

The third column selection circuit 12-3 comprises NMOS transistor 123_0 to NMOS transistor 123_$n$−1 whose drain or source terminals are connected to line SSL_0 (node N3), and NMOS transistor 123_$n$ to NMOS transistor 123_$2n$−1 whose drain or source terminals are connected to line SSL_1 (node N4). The group of NMOS transistors whose drain or source terminals are connected to line SSL_0 (node N3) will be referred to as group GP2, and the group of NMOS transistors whose drain or source terminals are connected to line SSL_1 (node N4) will be referred to as group GP3.

The control gate electrodes of NMOS transistor 123_0 to NMOS transistor 123_$n$−1 are coupled with control signal lines CSL_0 to CSL_n−1, respectively. When control signal line CSL_0 to control signal line CSL_n−1 are at the "H" level, NMOS transistor 123_0 to NMOS transistor 123_$n$−1 electrically connect line SSL_0 (node N3) and source lines SL_0 to SL_n−1, respectively.

The control gate electrodes of NMOS transistor 123_$n$ to NMOS transistor 123_$2n$−1 are coupled with control signal line CSL_0 to control signal line CSL_n−1, respectively. When control signal line CSL_0 to control signal line CSL_n−1 are at the "H" level, NMOS transistor 123_$n$ to NMOS transistor 123_$2n$−1 electrically connect line SSL_1 (node N4) and source lines SL_n to SL_$2n$−1, respectively.

The lines of control signal line CSL_0 to control signal line CSL_n−1 extend in the X direction and are arranged in parallel to one another without any intersection. Control signal line CSL_0 to control signal line CSL_n−1 are coupled to each of group GP2 and group GP3. That is, one transistor of group GP2 and one transistor of group GP3 can be controlled using single control signal line CSL. For this reason, in the third column selection circuit 12-3, two columns of transistor groups (n transistors) are arranged in the X direction.

Word line WL_0 to word line WL_m (m: an integer) are selected by word line driver 14-1.

In connection with the present embodiment, each of the second column selection circuit 12-2 and fourth column selection circuit 12-4 was described as including two switch transistors. However, the number of switch transistors is not limited to this, and can be changed, as required. Where the number of switch transistors is increased, the number of control signal lines (SCBL and SCSL) used for controlling the switch transistors, the number of lines (SBL and SSL), and the number of transistor groups provided in each of the first column selection circuit 12-1 and third column selection circuit 12-3 are increased, accordingly.

<1-2> Operation

Operating waveforms of the first column selection circuit 12-1 to fourth column selection circuits 12-4 will be described with reference to FIG. 6.

Figure 6:
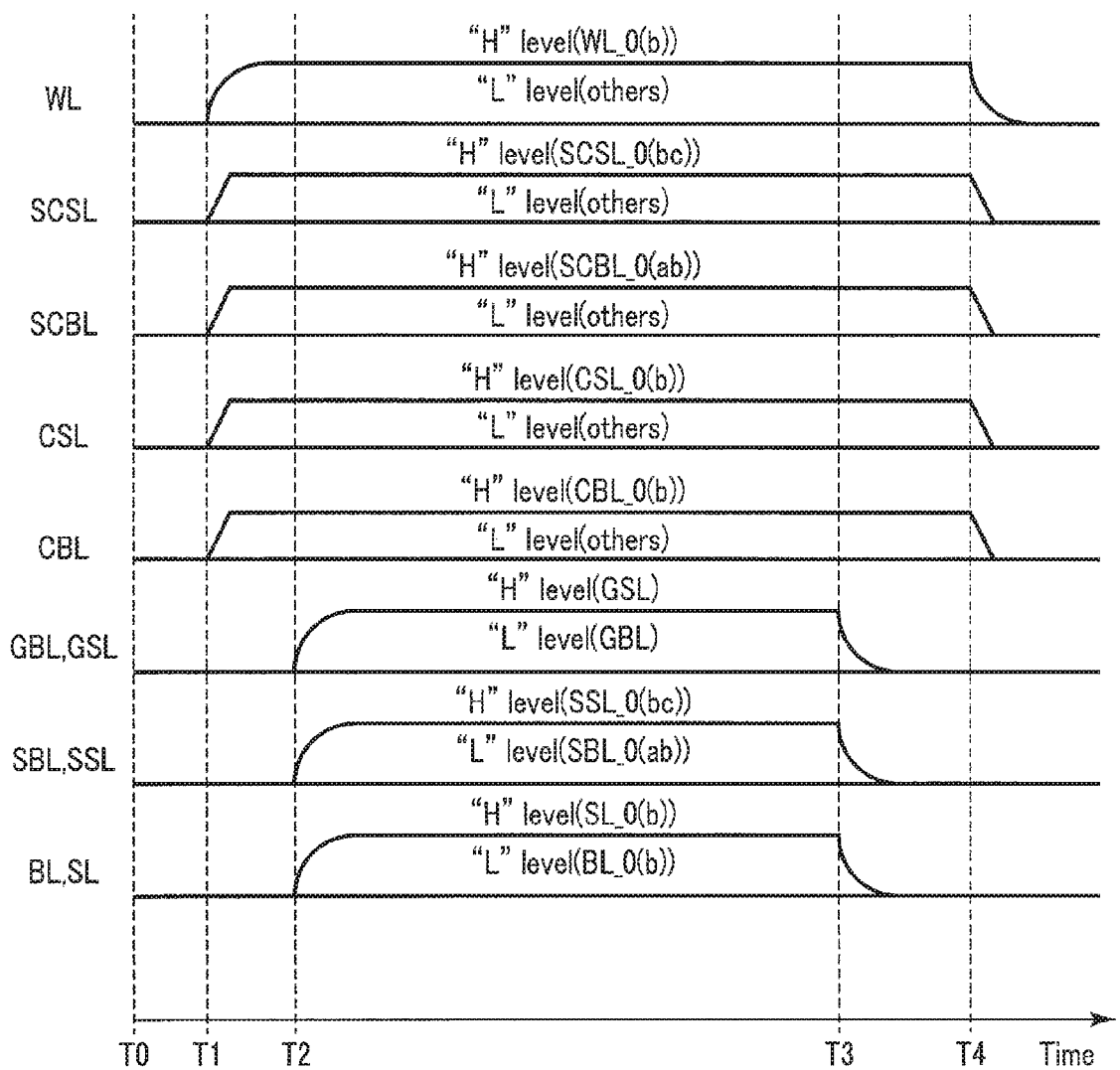
FIG. 6 is a waveform chart illustrating a write operation performed by the semiconductor storage device of the first embodiment.

FIG. 6 illustrates how the semiconductor storage device 1 performs a write operation, referring to the case where memory cell MC connected to word line WL_0($b$), bit line BL_0($b$) and source line SL_0($b$) (i.e., the memory cell of block 11-1($b$)) is selected.

[Time T0]

At time T0, the controller 17 sets the voltages applied to word line WL and control signal lines SCSL, SCBL, CSL and CBL, global bit line GBL (bit line BL) and global source line GLS (source line SL) at the "L(low)" level. As a result, transistor 23 of selected memory cell MC, transistors 121_0 to 121_$2n$−1 of the first column selection circuit 12-1, transistors 122_0 to 122_$2n$−1 of the second column selection circuit 12-2, transistors 123_0 to 123_$2n$−1 of the third column selection circuit 12-3, and transistors 124_0 to 124_$2n$−1 of the fourth column selection circuit 12-4 are set in the OFF state.

[Time T1]

At time T1, the controller 17 sets the voltages applied to selection word line WL_0($b$), control signal lines SCSL_0 ($bc$), SCBL_0($ab$), CSL_0($b$) and CBL_0($b$) at the "H" level.

As a result, transistors 124_0(*bc*), 123_0(*b*), 122_0(*ab*) and 121_0(*b*) and transistor 23 of selection memory cell MC are set in the ON state.

As a result, selection bit line BL_0(*b*) is electrically connected to global bit line GBL by way of line SBL_0(*ab*). In addition, selection source line SL_0(*b*) is electrically connected to global source line GSL by way of line SSL_0 (*bc*).

In the meantime, the first column selection circuit 12-1(*a*) and the third column selection line 12-3(*c*) perform a non-selection operation. Therefore, line SBL_0(*ab*) is not connected to bit line BL of block 11-1(*a*). Line SSL_0(*bc*) is not connected to source line SL of block 11-1(*c*).

[Time T2]

At time T2, the write driver applies a voltage to global bit line GBL or global source line GSL, based on the write data received from the host. In the present embodiment, the write driver applies an "L"-level voltage to global bit line GBL and an "H"-level voltage to global source line GSL. If the write data is of opposite polarity, global bit line GBL and global source line GSL are applied with an "H"-level voltage and an "L"-level voltage, respectively.

At time T2, the controller 17 sets the voltage applied to global source line GSL (selection source line SL_0(*b*)) at the "H" level.

As a result, in selection memory cell MC, a current flows from source line SL_0(*b*) to bit line BL_0(*b*), and a write operation is performed for memory cell MC.

[Time T3]

At time T3, the controller 17 sets the voltage to global source line GSL (selection source line SL_1(*b*)) and the voltage to global bit line GBL at the same potential level. As a result, the write operation for memory cell MC is ended.

[Time T4]

At time T4, the controller 17 sets the voltages applied to selection word line WL_0(*b*) and control signal lines SCSL_0(*bc*), SCBL_0(*ab*), CSL_0(*b*) and CBL_0(*b*) at the "L(low)" level. As a result, selected bit line BL_0(*b*) is electrically disconnected from global bit line GBL, and selected source line SL_0 is electrically disconnected from global source line GSL. Thus, the initial state is established in which the bit lines BL are not connected to global bit line GBL and the source lines SL are not connected to global source line GSL.

Although a write operation was described above, a read operation is performed in a similar manner.

<1-3> Advantage

In the above-mentioned embodiment, the column selection circuits are made up of two-circuit configurations. The first column selection circuit 12-1 and the third column selection circuit 12-3 are provided for each block 11-1, and the second column selection circuit 12-2 and the fourth column selection circuit 12-4 are provided for each pair of blocks adjacent in the Y direction. As should be clear from this, the first column selection circuit 12-1 and the third column selection circuit 12-3 are used for a selection operation performed in one block 11-1, while the second column selection circuit 12-2 and the fourth column selection circuit 12-4 are commonly used for a selection operation performed in two blocks 11-1. As a result, the circuit area of the semiconductor storage device 1 can be reduced.

To facilitate understanding of the advantage of the present embodiment, a comparative example will be described.

<1-3-1> Comparative Example 1

Comparative example 1 will be described with reference to FIGS. 7 and 8.

Figure 7:
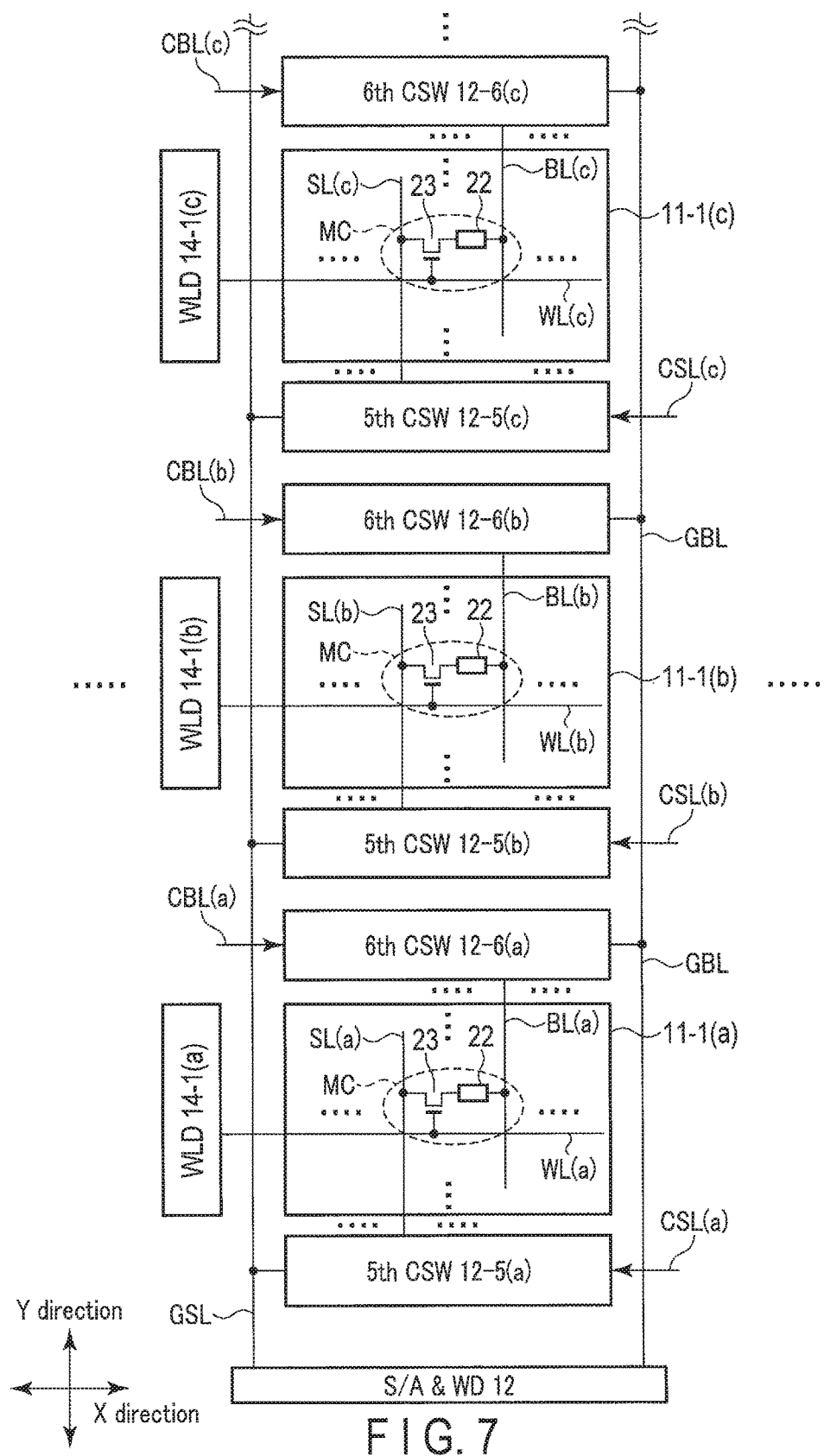
FIG. 7 illustrates a connection between a column selection circuit and blocks of a semiconductor storage device according to comparative example 1 of the first embodiment.

According to comparative example 1, a fifth column selection circuit 12-5 and a sixth column selection circuit 12-6 are provided for each block, as shown in FIGS. 7 and 8.

For example, there may be a case where 32 bit lines BL and 32 source lines SL are provided in each block 11-1. In this case, the fifth column selection circuit 12-5 is provided with 32 transistors for selecting 32 source lines SL. Likewise, the sixth column selection circuit 12-6 is provided with 32 transistors for selecting 32 bit lines BL.

As shown in FIG. 8, the sixth column selection circuit 12-6 uses 32 control signal lines to select 32 transistors. The lines of the 32 control signal lines extend in the X direction and are arranged in parallel to one another without any intersection. For this reason, in the sixth column selection circuit 12-6, 32 transistors are arranged in an array extending in the Y direction.

On the other hands, in the above-mentioned embodiment, the second column selection circuit 12-2 includes two transistors, and the first column selection circuit 12-1 includes 32 transistors. In the above-mentioned embodiment, however, the 32 transistors belong to two groups, namely, group GP0 connected to transistor 122_0 and group GP1 connected to transistor 122_1. The transistors belonging to group GP0 and the transistors belonging to group GP1 share 16 control signal lines. For this reason, in the first column selection circuit 12-1, 16 transistors are arranged in an array extending in the Y direction.

As can be seen from the above, the above-mentioned embodiment employs 18 transistors (two transistors of the second column selection circuit 12-2 and 16 transistors of the first column selection circuit 12-1) arrayed in the Y direction, in order to connect bit lines BL to global bit line GBL. In contrast, comparative example 1 employs as many as 32 transistors arrayed in the Y direction in order to connect bit lines BL to global bit line GBL.

What was described above holds true of the relationship of the fifth column selection circuit 12-5 with the third column selection circuit 12-3 and the fourth column selection circuit 12-4. Therefore, the circuit areas of the first column selection circuit 12-1 to the fourth column selection circuit 12-4 are smaller than the circuit areas of the fifth column selection circuit 12-5 and the sixth column selection circuit 12-6.

In comparative example 1, a leak current path is present in the sixth column selection circuit 12-6 between global bit line GBL and non-selection bit line BL. In the above-mentioned embodiment, the leak path between global bit line GBL and non-selection bit line BL (excepting a block sharing a selected block 11-1 and column selection circuit 12-2) includes a series connection of second column selection circuit 12-2 and first column selection circuit 12-1. For this reason, the above-mentioned embodiment can suppress the leak current more effectively than comparative example 1, which employs a one-circuit-configuration column selection circuit. In comparative example 1, the diffusion layer junction capacitance corresponding to 32 transistors of each of the sixth column selection circuits is added to the capacitance of global bit line GBL. In the above-mentioned embodiment, the diffusion layer junction capacitance corresponding to 2 transistors of each of the second column selection circuits is added to the capacitance of global bit line GBL, so that the above-mentioned embodiment can reduce the capacitance of global bit line GBL more than comparative example 1.

If viewed from global source line GSL, what was described above holds true of the relationship of the fifth column selection circuit 12-5 with the third column selection circuit 12-3 and the fourth column selection circuit 12-4. In the above-mentioned embodiment, the leak path between global source line GSL and non-selection source line SL (excepting a block sharing a selected block 11-1 and column selection circuit 12-2) can be reduced more effectively than comparative example 1, and the capacitance of global source line GSL can be reduced more effectively than comparative example 1.

If the capacitance of global bit line GBL and the capacitance of global source line GSL are reduced, the sensing time can be shortened in a read operation, and the amount of operating current can be reduced in a write operation. In addition, the suppression of a leak current in global bit line GBL and global source line GSL leads to a more robust read/write operation. As described above, the present embodiment reduces the signal lines and circuit area more effectively than comparative example 1, and enables a robust read/write operation.

<1-3-2> Comparative Example 2

Comparative example 2 will be described with reference to FIG. 9.

Figure 9:
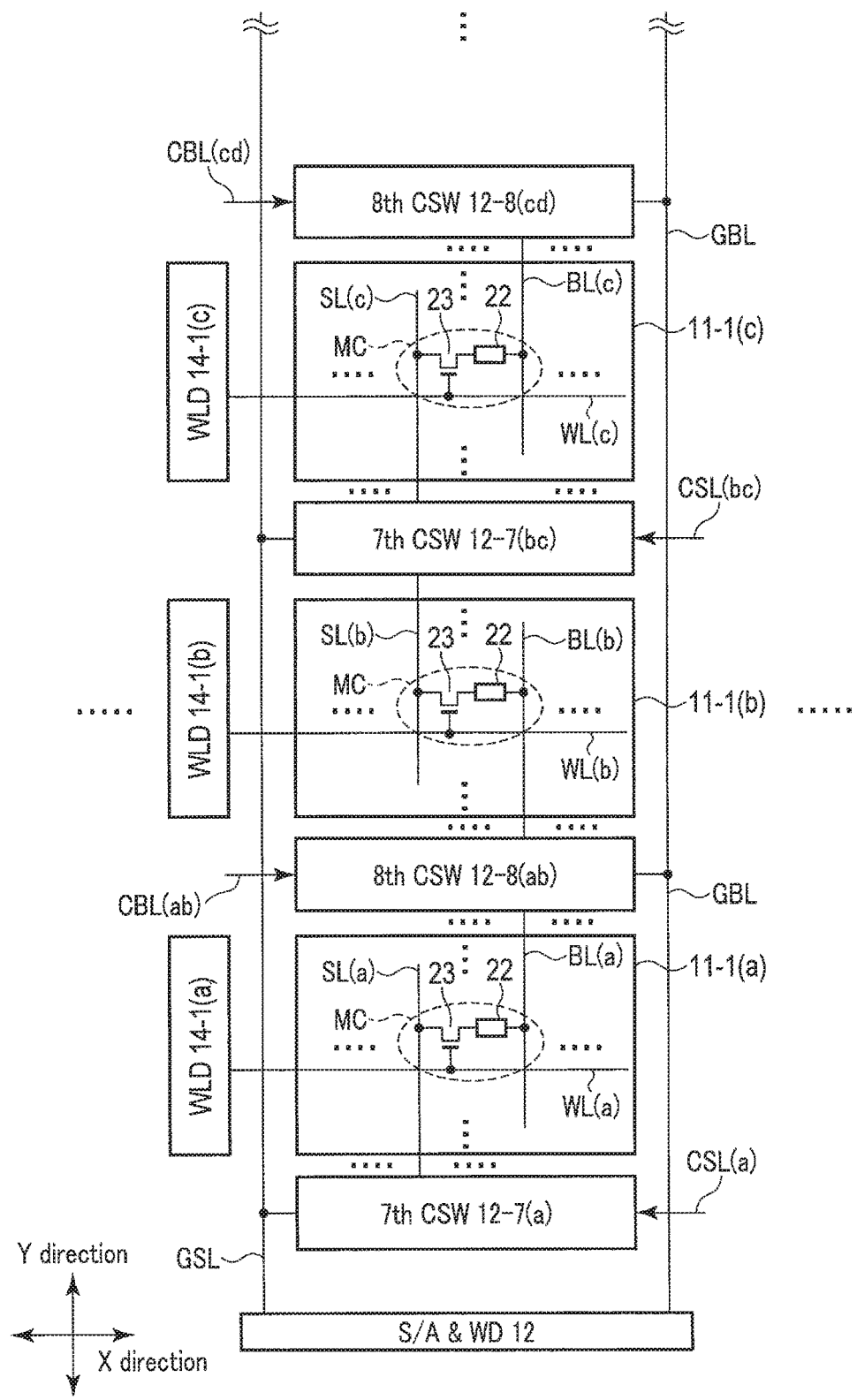
FIG. 9 illustrates a connection between a column selection circuit and blocks of a semiconductor storage device according to comparative example 2 of the first embodiment.

According to comparative example 2, a seventh column selection circuit 12-7 and an eighth column selection circuit 12-8 are provided for blocks adjacent in the Y direction, as shown in FIG. 9.

For example, there may be a case where 32 bit lines BL and 32 source lines SL are provided in each block 11-1. In this case, the seventh column selection circuit 12-7 is provided with 32 transistors for selecting 32 source lines SL of two blocks 11-1. Likewise, the eighth column selection circuit 12-8 is provided with 32 transistors for selecting 32 bit lines BL of two blocks 11-1.

In comparative example 2, in each of the seventh column selection circuit 12-7 and eighth column selection circuit 12-8, 32 transistors are arranged in an array extending in the Y direction. However, since the seventh column selection circuit 12-7 and the eighth column selection circuit 12-8 are shared by the blocks adjacent in the Y direction, the circuit area required is smaller than the circuit area required in comparative example 1.

Figure 10:
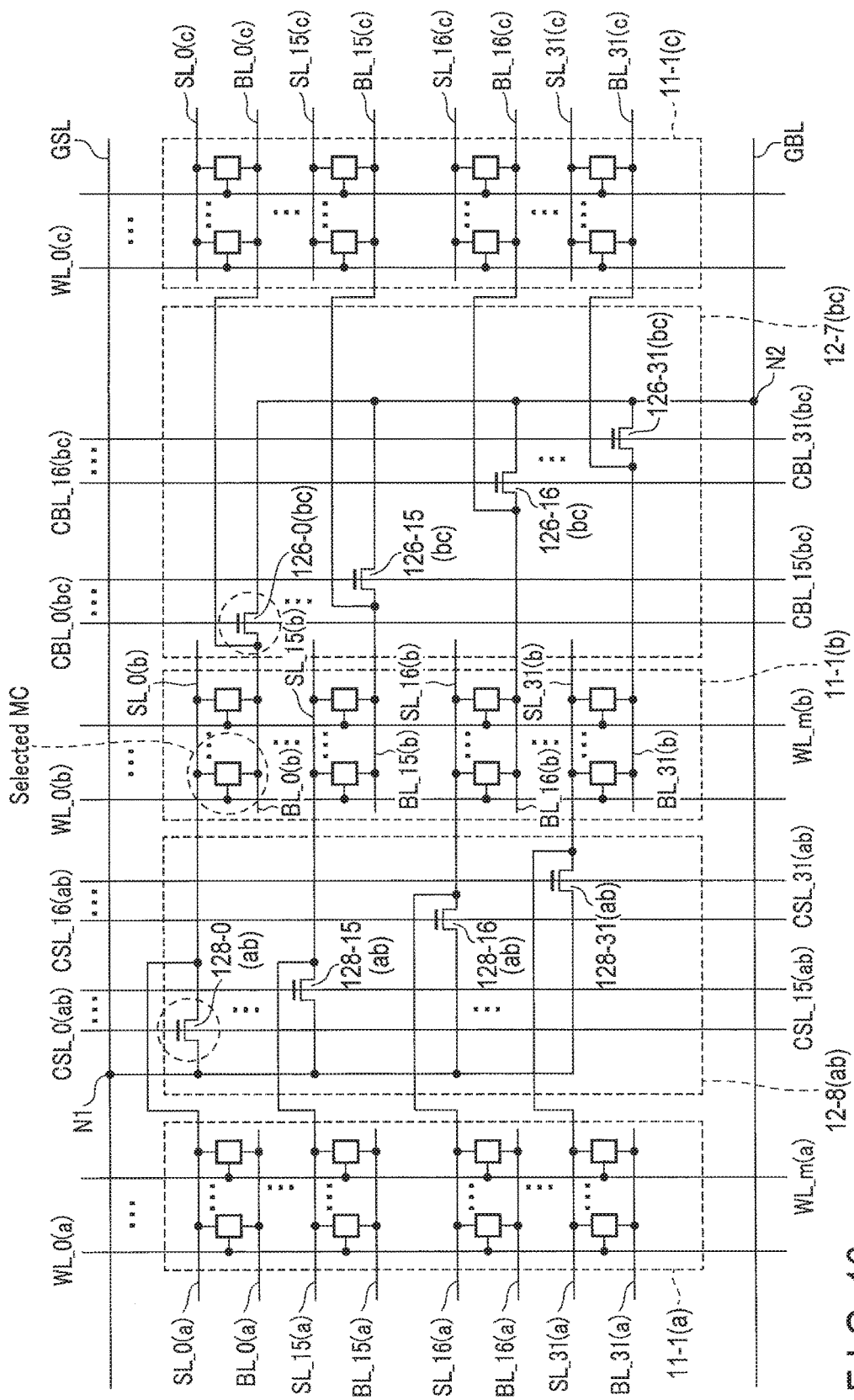
FIG. 10 is a specific circuit diagram illustrating the column selection circuit of the semiconductor storage device of comparative example 2 of the first embodiment.

A description will be given, with reference to FIG. 10, of how comparative example 2 selects memory cell MC of block 11-1(*b*). How the semiconductor storage device 1 of comparative example 2 operates will be described, referring to the case where memory cell MC connected to word line WL_0 (*b*), bit line BL_0(*b*) and source line SL_0(*b*)) (i.e., the memory cell of block 11-1(*b*)) is selected.

To select memory cell MC of block 11-1(*b*), transistor 128_0(*ab*) is set in the ON state. As a result, the source line SL_0(*a*) of block 11-1(*a*) and the source line SL_0(*b*) of block 11-1(*b*) are connected to global source line GSL.

To select memory cell MC of block 11-1(*b*), transistor 126_0(*bc*) is set in the ON state. As a result, the bit line BL_0(*c*) of block 11-1(*c*) and the bit line BL_0(*b*) of block 11-1(*b*) are connected to global bit line GBL.

According to comparative example 2, global source line GSL is electrically connected to the source line SL_0(*a*) of an unselected block 11-1(*a*), and global bit line GBL is electrically connected to the bit line GL_0(*c*) of an unselected block 11-1(*c*). Due to this, the load capacitances of global source line GSL and global bit line GBL increase, and an increasing amount of leak current may flow between global bit line GBL and global source line GSL by way of unselected cells. For this reason, in the read operation, the sensing time may be long and a sensing fail may occur; in the write operation, the amount of current required for charging bit lines and source lines increases.

However, in the above-mentioned embodiment, when memory cell MC of block 11-1(*b*) is selected, the first column selection circuit 12-1(*a*) related to source line SL(a) of block 11-1(*a*) is in the OFF state, and the third column selection circuit 12-3(*c*) related to the bit line BL(c) of block 11-1(*c*) is in the OFF state. Therefore, the problems described above do not arise.

As described above, the above-mentioned embodiment enables the circuit area of the semiconductor storage device 1 to decrease without deteriorating the performance of the semiconductor storage device 1.

<2> Second Embodiment

The second embodiment will be described. The first embodiment was described, referring to the case where the column selection circuits are made of two-circuit configurations. The second embodiment will be described, referring to the case where the column selection circuits are made of three-circuit configurations.

<2-1> Configuration

<2-1-1> Relationships Between Ninth Column Selection Circuits 12-9 to Fourteenth Column Selection Circuits 12-14 and Blocks 11-1

Figure 11:
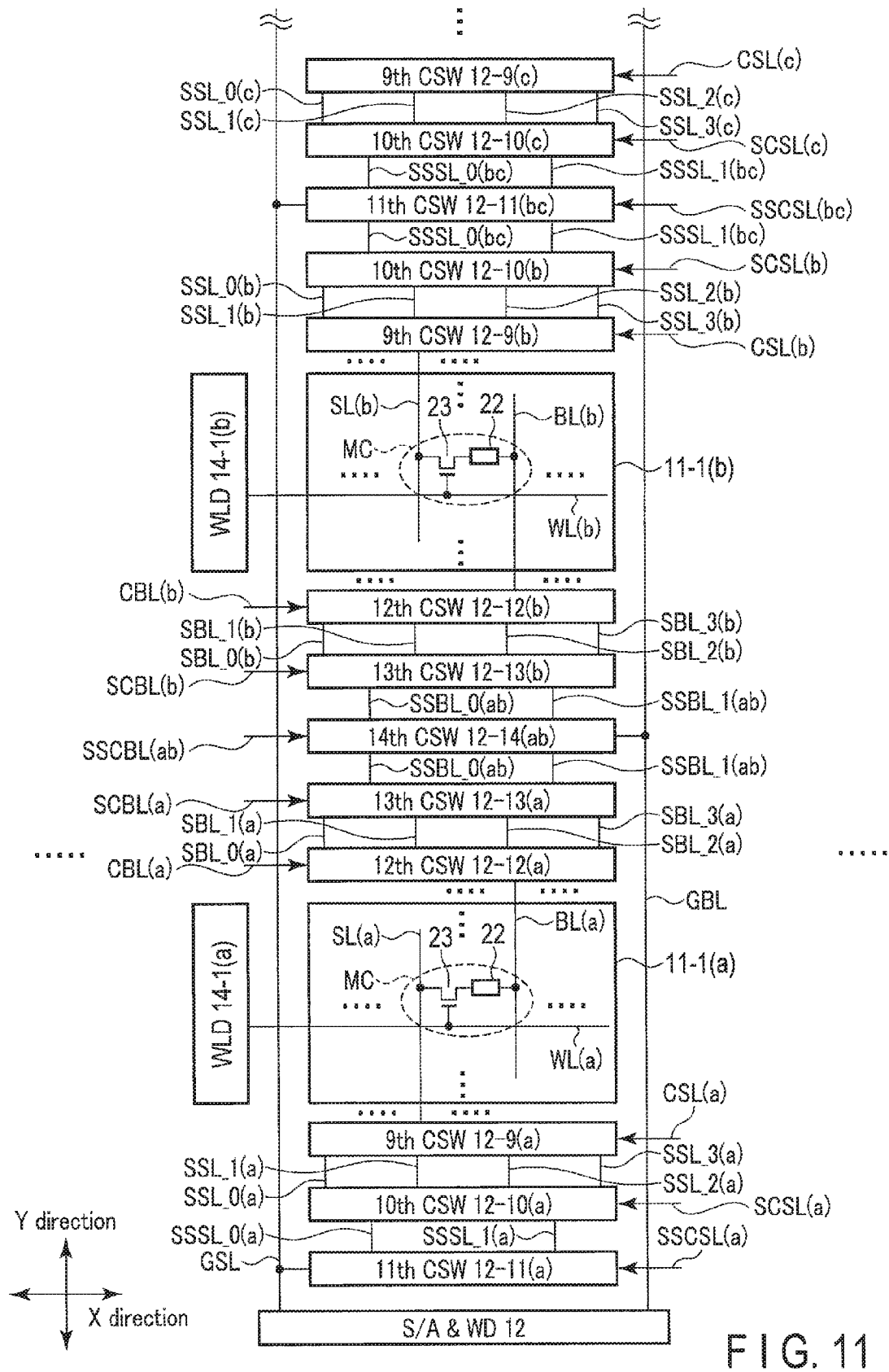
FIG. 11 illustrates a connection between a column selection circuit and blocks of a semiconductor storage device according to a second embodiment.

FIG. 11 illustrates block 11-1(*a*) close to the sense amplifier/write driver 12 and block 11-1(*b*) adjacent to block 11-1(*a*) in the Y direction.

As shown in FIG. 11, the column selection circuits for controlling the connection between the source line SL and global source line GSL are configured as three-circuit configurations, namely, a ninth column selection circuit 12-9, a tenth column selection circuit 12-10 and an eleventh column selection circuit 12-11. The ninth column selection circuit 12-9 is a circuit for selecting source lines SL of blocks 11-1. The tenth column selection circuit 12-10 is a circuit for selecting a group of transistors of the ninth column selection circuit 12-9. The eleventh column selection circuit 12-11 is a circuit for selecting a group of transistors of the tenth column selection circuit 12-10. The eleventh column selection circuit 12-11 is located between two tenth column selection circuits 12-10 adjacent in the Y direction. The eleventh column selection circuit 12-11 is used when either one of the two blocks 11-1 adjacent in the Y direction is selected.

As shown in FIG. 11, the column selection circuits for controlling the connection between the bit line BL and global bit line GBL are configured as three-circuit configurations, namely, a twelfth column selection circuit 12-12, a thirteenth column selection circuit 12-13 and a fourteenth column selection circuit 12-14. The twelfth column selection circuit 12-12 is a circuit for selecting bit lines BL of blocks 11-1. The thirteenth column selection circuit 12-13 is a circuit for selecting a group of transistors of the twelfth column selection circuit 12-12. The fourteenth column selection circuit 12-14 is a circuit for selecting a group of transistors of the thirteenth column selection circuit 12-13.

The fourteenth column selection circuit 12-14 is located between two thirteenth column selection circuits 12-13 adjacent in the Y direction. The fourteenth column selection circuit 12-14 is used when either one of the two blocks 11-1 adjacent in the Y direction is selected.

The ninth column selection circuit 12-9 is provided with a plurality of switch transistors, and controls the connection between line SSL and source line SL, based on control signal line CSL supplied from the column decoder 13.

The tenth column selection circuit 12-10 is provided with a plurality of switch transistors, and controls the connection between line SSSL and source line SSL, based on control signal line SCSL supplied from the column decoder 13.

The eleventh column selection circuit 12-11 is provided with a plurality of switch transistors, and controls the connection between line GSL and line SSSL, based on control signal line SSCSL supplied from the column decoder 13.

The twelfth column selection circuit 12-12 is provided with a plurality of switch transistors, and controls the connection between line SBL and bit line BL, based on control signal line CBL supplied from the column decoder 13.

The thirteenth column selection circuit 12-13 is provided with a plurality of switch transistors, and controls the connection between line SSBL and source line SBL, based on control signal line SCBL supplied from the column decoder 13.

The fourteenth column selection circuit 12-14 is provided with a plurality of switch transistors, and controls the connection between line GBL and line SSBL, based on control signal line SSCBL supplied from the column decoder 13.

As shown in FIG. 11, the eleventh column selection circuit 12-11, which is provided at a Y-direction end of memory cell array 11 and related to block 11-1(a), is used for selecting one block 11-1(a). This is because block 11-1(a) is located at the end, and no other block 11-1 is present in the direction toward the sense amplifier/write driver 12. Although not shown, the fourteenth column selection circuit 12-14, which is provided at the other Y-direction end of memory cell array 11 (i.e., the end far from the sense amplifier/write driver circuit 12) and related to block 11-1, is used for selecting one block 11-1.

As shown in FIG. 11, the elements arranged in the Y direction from the sense amplifier/write driver 12 are: eleventh column selection circuit 12-11(a), tenth column selection circuit 12-10(a), ninth column selection circuit 12-9(a), block 11-1(a), twelfth column selection circuit 12-12(a), thirteenth column selection circuit 12-13(a), fourteenth column selection circuit 12-14(ab), thirteenth column selection circuit 12-13(b), twelfth column selection circuit 12-12(b) . . . . In this arrangement, the position of ninth column selection circuit 12-9, tenth column selection circuit 12-10 and eleventh column selection circuit 12-11 and the position of twelfth column selection circuit 12-12, the thirteenth column selection circuit 12-13 and fourteenth column selection circuit 12-14 may be interchanged. To be specific, the elements arranged in the Y direction from the sense amplifier/write driver 12 may be: fourteenth column selection circuit 12-14(a), thirteenth column selection circuit 12-13(a), twelfth column selection circuit 12-12(a), block 11-1(a), ninth column selection circuit 12-9(a), tenth column selection circuit 12-10(a), eleventh column selection circuit 12-11(ab), tenth column selection circuit 12-10(b), ninth column selection circuit 12-9(b) . . . .

<2-1-2> Circuit Configurations of Ninth Column Selection Circuit 12-9 to Eleventh Column Section Circuit 12-11

Figure 12:
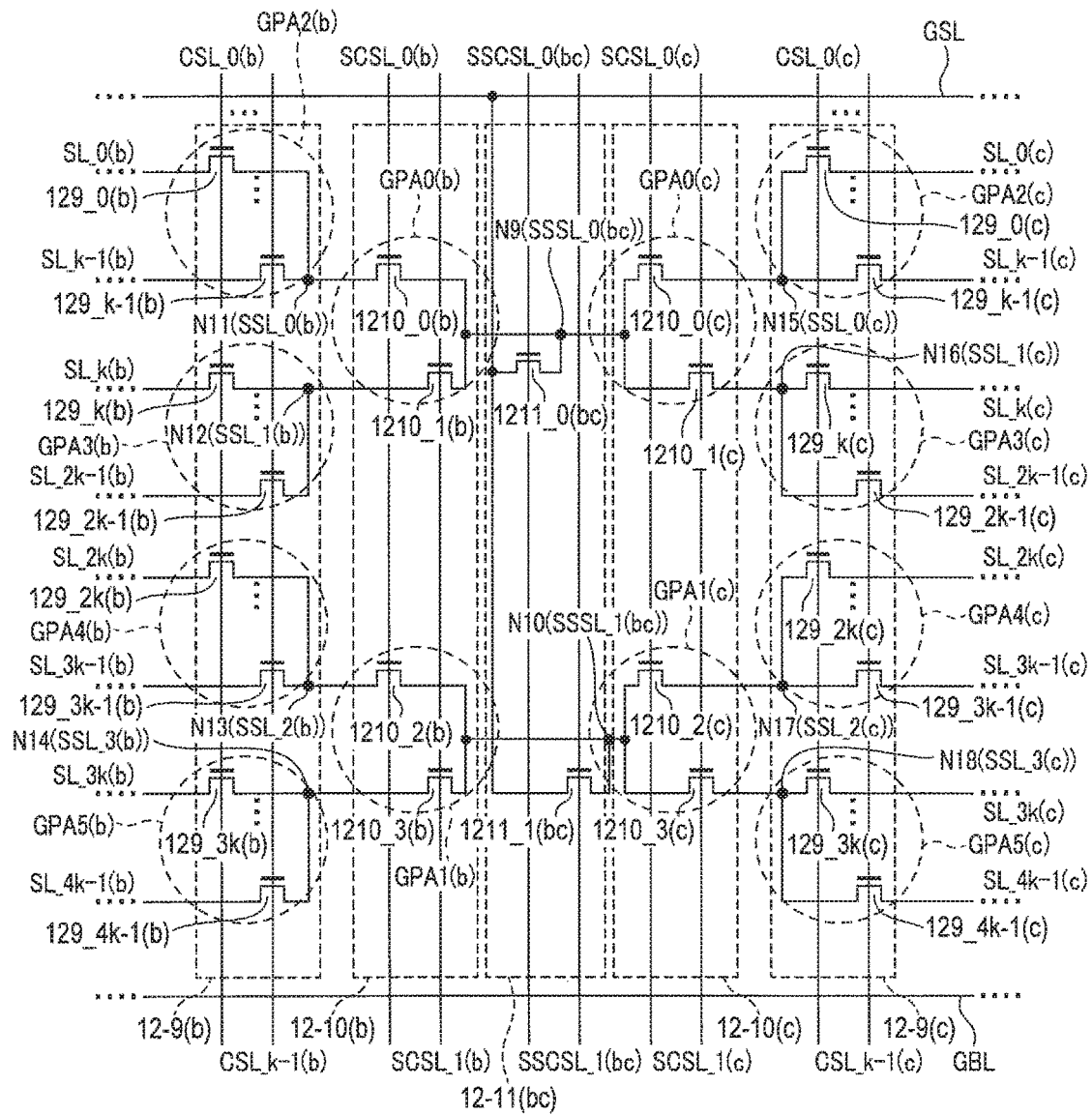
FIG. 12 is a specific circuit diagram illustrating the column selection circuit of the semiconductor storage device of the second embodiment.
Figure 12:
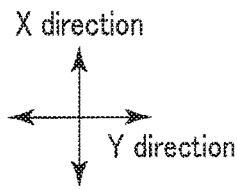

Specific circuit configurations of the ninth column selection circuit 12-9 to the eleventh column selection circuit 12-11 will be described with reference to FIG. 12.

The eleventh column selection circuit 12-11 comprises NMOS transistor 1211_0 and NMOS transistor 1211_1. When control signal line SSCSL_0 is at the "H" level, NMOS transistor 1211_0 electrically connects global source line GSL (node N1) and line SSSL_0 (node N9). When control signal line SSCSL_1 is at the "H" level, NMOS transistor 1211_1 electrically connects global source line GSL (node N1) and line SSSL_1 (node N10).

The tenth column selection circuit 12-10 comprises NMOS transistor 1210_0 and NMOS transistor 1210_1 whose first terminals (sources) are connected to line SSSL_0 (node N9), and NMOS transistor 1210_2 and NMOS transistor 1210_3 whose first terminals (sources) are connected to line SSSL_1 (node N10). The group of NMOS transistors whose first terminals (sources) are connected to line SSSL_0 (node N9) will be referred to as group GPA0, and the group of NMOS transistors whose first terminals are connected to line SSSL_1 (node N10) will be referred to as group GPA1.

The control gate electrodes of NMOS transistor 1210_0 and NMOS transistor 1210_1 are coupled with control signal lines SCSL_0 to SCSL_1, respectively.

When control signal line SCSL_0 is at the "H" level, NMOS transistor 1210_0 electrically connects line SSSL_0 (node N9) and line SSL_0 (node N1). Likewise, when control signal line SCSL_1 is at the "H" level, NMOS transistor 1210_1 electrically connects line SSSL_0 (node N9) and line SSL_1 (node N12).

When control signal line SCSL_0 is at the "H" level, NMOS transistor 1210_2 electrically connects line SSSL_1 (node N10) and line SSL_2 (node N13). Likewise, when control signal line SCSL_1 is at the "H" level, NMOS transistor 1210_3 electrically connects line SSSL_1 (node N10) and line SSL_3 (node N14).

The lines of control signal line SCSL_0 to control signal line SCSL_1 extend in the X direction and are arranged in parallel to one another without any intersection. Control signal line SCSL_0 and control signal line SCSL_1 are coupled to group GPA0 and group GPA1, respectively. That is, one transistor of group GPA0 and one transistor of group GPA1 can be controlled using single control signal line SCSL. For this reason, in the tenth column selection circuit 12-10, two columns of transistor groups (two transistors) are arranged substantially in the X direction.

The ninth column selection circuit 12-9 comprises NMOS transistor 129_0 to NMOS transistor 129_$k$-1 (k: an integer of at least 2) whose first terminals (sources) are connected to line SSL_0 (node N11), and NMOS transistor 129_$k$ to NMOS transistor 129_2$k$-1 whose first terminals (sources) are connected to line SSL_1 (node N12). The ninth column selection circuit 12-9 comprises NMOS transistor 129_2$k$ to NMOS transistor 129_3$k$-1 whose first terminals (sources) are connected to line SSL_2 (node N13), and NMOS transistor 129_3$k$ to NMOS transistor 129_4$k$-1 whose first terminals (sources) are connected to line SSL_3 (node N14). The group of NMOS transistors whose first terminals (sources) are connected to line SSL_0 (node N11) will be referred to as group GPA2, the group of NMOS transistors whose first terminals (sources) are connected to line SSL_1 (node N12) will be referred to as group GPA3, the group of NMOS transistors whose first terminals (sources) are connected to line SSL_2 (node N13) will be referred to as group GPA4, and the group of NMOS transistors whose first terminals are connected to line SSL_3 (node N14) will be referred to as group GPA5.

The control gate electrodes of NMOS transistor 129_0 to NMOS transistor 129_$k$–1 are coupled with control signal lines CSL_0 to CSL_$k$–1, respectively.

When control signal line CSL_0 is at the "H" level, NMOS transistor 129_0 electrically connects line SSL_0 (node N11) and source line SL_0. Likewise, when control signal line CSL_1 to control signal line CSL_$k$–1 are at the "H" level, NMOS transistor 129_1 to NMOS transistor 129_$k$–1 electrically connect line SSL_0 (node N11) and source lines SL_1 to SL_$k$–1, respectively.

The control gate electrodes of NMOS transistor 129_$k$ to NMOS transistor 129_$k$–1 are coupled with control signal lines CSL_0 to CSL_$k$–1, respectively.

When control signal line CSL_0 is at the "H" level, NMOS transistor 129_$k$ electrically connects line SSL_1 (node N12) and source line SL_$k$. Likewise, when control signal line CSL_1 to control signal line CSL_$k$–1 are at the "H" level, NMOS transistor 129_$k$+1 to NMOS transistor 129_$2k$–1 electrically connect line SSL_1 (node N12) and source lines SL_$k$+1 to SL_$2k$–1, respectively.

The control gate electrodes of NMOS transistor 129_$2k$ to NMOS transistor 129_$3k$–1 are coupled with control signal lines CSL_0 to CSL_$k$–1, respectively.

When control signal line CSL_0 is at the "H" level, NMOS transistor 129_$2k$ electrically connects line SSL_2 (node N13) and source line SL_$2k$. Likewise, when control signal line CSL_1 to control signal line CSL_$k$–1 are at the "H" level, NMOS transistor 129_$2k$+1 to NMOS transistor 129_$3k$-1 electrically connect line SSL_2 (node N13) and source lines SL_$2k$+1 to SL_$3k$–1, respectively.

The control gate electrodes of NMOS transistor 129_$3k$ to NMOS transistor 129_$4k$–1 are coupled with control signal lines CSL_0 to CSL_$k$–1, respectively.

When control signal line CSL_0 is at the "H" level, NMOS transistor 129_$3k$ electrically connects line SSL_3 (node N14) and source line SL_$3k$. Likewise, when control signal line CSL_1 to control signal line CSL_$k$–1 are at the "H" level, NMOS transistor 129_$3k$+1 to NMOS transistor 129_$4k$–1 electrically connect line SSL_3 (node N14) and source lines SL_$3k$+1 to SL_$4k$–1, respectively.

The lines of control signal line CSL_0 to control signal line CSL_$k$–1 extend in the X direction and are arranged in parallel to one another without any intersection. Control signal line CSL_0 to control signal line CSL_$k$–1 are coupled to each of group GPA2 to group GPA5. That is, one transistor of group GPA2, one transistor of group GPA3, one transistor of group GPA4 and one transistor of group GPA5 can be controlled using single control signal line CSL. For this reason, in the ninth column selection circuit 12-9, four columns of transistor groups ($k$ transistors in each column) are arranged substantially in the X direction.

<2-1-3> Circuit Configurations of Twelfth Column Selection Circuit 12-12 to Fourteenth Column Section Circuit 12-14

Specific circuit configurations of the twelfth column selection circuit 12-12 to fourteenth column selection circuit 12-14 will be described with reference to FIG. 13.

The fourteenth column selection circuit 12-14 comprises NMOS transistor 1214_0 and NMOS transistor 1214_1. When control signal line SSCBL_0 is at the "H (High)" level, NMOS transistor 1214_0 electrically connects global bit line GBL (node N2) and line SSBL_0 (node N19). When control signal line SCBL_1 is at the "H" level, NMOS transistor 1214_1 electrically connects global bit line GBL (node N2) and line SSBL_1 (node N20).

The thirteenth column selection circuit 12-13 comprises NMOS transistor 1213_0 and NMOS transistor 1213_1 whose first terminals (drains) are connected to line SSBL_0 (node N19), and NMOS transistor 1213_2 and NMOS transistor 1213_3 whose first terminals (drains) are connected to line SSBL_1 (node N20). The group of NMOS transistors whose first terminals (drains) are connected to line SSBL_0 (node N19) will be referred to as group GPA6, and the group of NMOS transistors whose first terminals (drains) are connected to line SSBL_1 (node N20) will be referred to as group GPA7.

The control gate electrodes of NMOS transistor 1213_0 and NMOS transistor 1213_1 are coupled with control signal lines SCBL_0 to SCBL_1, respectively.

When control signal line SCBL_0 is at the "H" level, NMOS transistor 1213_0 electrically connects line SSBL_0 (node N19) and line SBL_0 (node N21). Likewise, when control signal line SCBL_1 is at the "H" level, NMOS transistor 1213_1 electrically connects line SSBL_0 (node N19) and line SBL_1 (node N22).

When control signal line SCBL_0 is at the "H" level, NMOS transistor 1213_2 electrically connects line SSBL_1 (node N20) and line SBL_2 (node N23). Likewise, when control signal line SCBL_1 is at the "H" level, NMOS transistor 1213_3 electrically connects line SSBL_1 (node N20) and line SBL_3 (node N24).

The lines of control signal line SCBL_0 and control signal line SCBL_1 extend in the X direction and are arranged in parallel to one another without any intersection. Control signal line SCBL_0 and control signal line SCBL_1 are coupled to each of group GPA6 and group GPA7. That is, one transistor of group GPA6 and one transistor of group GPA7 can be controlled using single control signal line SCBL. For this reason, in the thirteenth column selection circuit 12-13, two columns of transistor groups (two transistors) are arranged substantially in the X direction.

The twelfth column selection circuit 12-12 comprises NMOS transistor 1212_0 to NMOS transistor 1212_$k$–1 whose first terminals (drains) are connected to line SBL_0 (node N21), and NMOS transistor 1212_$k$ to NMOS transistor 1212_$2k$–1 whose first terminals (drains) are connected to line SBL_1 (node N22). The twelfth column selection circuit 12-12 comprises NMOS transistor 1212_$2k$ to NMOS transistor 1212_$3k$–1 whose first terminals (drains) are connected to line SBL_2 (node N23), and NMOS transistor 1212_$3k$ to NMOS transistor 1212_$4k$–1 whose first terminals (drains) are connected to line SBL_3 (node N24). The group of NMOS transistors whose first terminals (drains) are connected to line SBL_0 (node N21) will be referred to as group GPA8, the group of NMOS transistors whose first terminals (drains) are connected to line SBL_1 (node N22) will be referred to as group GPA9, the group of NMOS transistors whose first terminals (drains) are connected to line SBL_2 (node N23) will be referred to as group GPA10, and the group of NMOS transistors whose first terminals are connected to line SBL_3 (node N24) will be referred to as group GPA11.

The control gate electrodes of NMOS transistor 1212_0 to NMOS transistor 1212_$k$–1 are supplied with control signal lines CBL_0 to CBL_k–1, respectively.

When control signal line CBL_0 is at the "H" level, NMOS transistor 1212_0 electrically connects line SBL_0 (node N21) and bit line BL_0. Likewise, when control signal line CBL_1 to control signal line CBL_k–1 are at the "H" level, NMOS transistor 1212_1 to NMOS transistor 1212_$k$–1 electrically connect line SBL_0 (node N21) and bit lines BL_1 to BL_k–1, respectively.

The control gate electrodes of NMOS transistor 1212_$k$ to NMOS transistor 1212_2$k$–1 are coupled with control signal lines CBL_0 to CBL_k–1, respectively.

When control signal line CBL_0 is at the "H" level, NMOS transistor 1212_$k$ electrically connects line SBL_1 (node N22) and bit line BL_k. Likewise, when control signal line CBL_1 to control signal line CBL_k–1 are at the "H" level, NMOS transistor 1212_$k$+1 to NMOS transistor 1212_2$k$–1 electrically connect line SBL_1 (node N22) and bit lines BL_k+1 to BL_2$k$–1, respectively.

The control gate electrodes of NMOS transistor 1212_2$k$ to NMOS transistor 1212_3$k$–1 are coupled with control signal lines CBL_0 to CBL_k–1, respectively.

When control signal line CBL_0 is at the "H" level, NMOS transistor 1212_2$k$ electrically connects line SBL_2 (node N23) and bit line BL_2$k$. Likewise, when control signal line CBL_1 to control signal line CBL_k–1 are at the "H" level, NMOS transistor 1212_2$k$+1 to NMOS transistor 1212_3$k$–1 electrically connect line SBL_2 (node N23) and bit lines BL_2$k$+1 to BL_3$k$–1, respectively.

The control gate electrodes of NMOS transistor 1212_3$k$ to NMOS transistor 1212_4$k$–1 are coupled with control signal lines CBL_0 to CBL_k–1, respectively.

When control signal line CBL_0 is at the "H" level, NMOS transistor 1212_3$k$ electrically connects line SBL_3 (node N24) and bit line BL_3$k$. Likewise, when control signal line CBL_1 to control signal line CBL_k–1 are at the "H" level, NMOS transistor 1212_3$k$+1 to NMOS transistor 1212_4$k$–1 electrically connect line SBL_3 (node N24) and bit lines BL_3$k$+1 to BL_4$k$–1, respectively.

The lines of control signal line CBL_0 to control signal line CBL_k–1 extend in the X direction and are arranged in parallel to one another without any intersection. Control signal line CBL_0 to control signal line CBL_k–1 are coupled to each of group GPA8 to group GPA11. That is, one transistor of group GPA8, one transistor of group GPA9, one transistor of group GPA10 and one transistor of group GP11 can be controlled using single control signal line CBL. For this reason, in the twelfth column selection circuit 12-12, four columns of transistor groups (k transistors in each column) are arranged substantially in the X direction.

In connection with the present embodiment, each of the eleventh column selection circuit 12-11 and fourteenth column selection circuit 12-14 was described as including two switch transistors. However, the number of switch transistors is not limited to this, and can be changed, as required.

In connection with the present embodiment, each of the tenth column selection circuit 12-10 and thirteenth column selection circuit 12-13 was described as including four switch transistors. However, the number of switch transistors is not limited to this, and can be changed, as required.

As described above, where the number of switch transistors is increased, the number of control signal lines used for controlling the switch transistors, the number of lines and the number of transistor groups are increased, accordingly.

<2-2> Advantage

In the above-mentioned embodiment, the column selection circuits are made up of three-circuit configurations. The ninth column selection circuit 12-9, tenth column selection circuit 12-10, twelfth column selection circuit 12-12 and thirteenth column selection circuit 12-13 are provided for each block 11-1, and the eleventh column selection circuit 12-11 and fourteenth column selection circuit 12-14 are provided for each pair of blocks adjacent in the Y direction.

Owing to this, the second embodiment provides substantially the same advantages as the first embodiment.

(Modifications)

In the above-described embodiments, the MRAM may be an STT-MRAM (spin-transfer torque magnetoresistive random access memory) utilizing a spin transfer phenomenon for magnetization reversal of a magnetic layer.

In this description, the MRAM that stores data using a magnetic tunnel junction (MTJ) element as the variable resistive element has been described by way of example. However, the embodiments are not limited to this example.

For example, the embodiments are applicable to a semiconductor storage device that stores data utilizing a resistance change, for example, a resistance change type memory as well as the MRAM, such as a ReRAM (resistive random access memory) and a PCRAM (phase-change random access memory).

Furthermore, the embodiments are also applicable to a semiconductor storage device that stores data by a resistance change with an applied current or an applied voltage, or reads the stored data by converting a difference in resistance due to a resistance change to a current difference or a voltage difference.

In the above embodiments, the transistors were described as NMOS transistors or PMOS transistors, but this is not restrictive.

In connection with the above embodiments, the bit line pair was described as having bit line BL and source line SL for descriptive purposes. However, the bit line pair may be made up of a first bit line and a second bit line.

While certain embodiments have been described, these embodiments have been presented by way of example only, and are not intended to limit the scope of the claims. Indeed, the novel methods and systems described herein may be embodied in a variety of other forms; furthermore, various omissions, substitutions and changes in the form of the methods and systems described herein may be made without departing from the spirit of the embodiments. The accompanying claims and their equivalents are intended to cover such forms or modifications as would fall within the scope and spirit of the embodiments.

What is claimed is:

1. A semiconductor storage device comprising:
a first memory area;
a first selection circuit which selects a bit line of the first memory area, the bit line of the first memory area extending in a first direction;
a second memory area;
a second selection circuit which selects a bit line of the second memory area, the bit line of the second memory area extending in the first direction; and
a third selection circuit arranged between the first selection circuit and the second selection circuit, and configured to select the first selection circuit or the second selection circuit,
wherein:
the first memory area, the first selection circuit, the third selection circuit, the second selection circuit, and the second memory area are aligned in this order in the first direction, the first selection circuit includes at least a first transistor group and a second transistor group, wherein the first transistor group and the second transistor group are configured to select the bit line of the first memory area, the second selection circuit includes at least a third transistor group and a fourth transistor group, wherein the third transistor group and the fourth transistor group are configured to select the bit line of the second memory area, and the third selection circuit selects the first transistor group and the third transistor group, or the second transistor group and fourth transistor group.

2. The semiconductor storage device of claim 1, wherein, when the bit line of the second memory area is selected, the semiconductor storage device causes the first selection circuit to perform a non-selection operation, and causes the second selection circuit and the third selection circuit to perform a selection operation.

3. The semiconductor storage device of claim 1, wherein:
at least the first transistor group and the second transistor group are coupled with a common first control signal line set,
at least the third transistor group and the fourth transistor group are coupled with a common second control signal line set,
the first control signal line set includes a plurality of control signal lines commonly coupled to a plurality of transistors of the first transistor group and the second transistor group, and
the second control signal line set includes a plurality of control signal lines commonly coupled to a plurality of transistors of the third transistor group and the fourth transistor group.

4. The semiconductor storage device of claim 3, wherein the third selection circuit electrically connects a global bit line to the first transistor group and the third transistor group or to the second transistor group and fourth transistor group, based on the control signal lines.

5. The semiconductor storage device of claim 1, further comprising:
a third memory area;
a fourth selection circuit which selects a source line of the third memory area;
a fifth selection circuit which selects a source line of the second memory area; and
a sixth selection circuit arranged between the fourth selection circuit and the fifth selection circuit and configured to select the fourth selection circuit or the fifth selection circuit.

6. The semiconductor storage device of claim 5, wherein:
the fourth selection circuit includes at least a fifth transistor group and a sixth transistor group, wherein the fifth transistor group and the sixth transistor group are configured to select the source line of the third memory area,
the fifth selection circuit includes at least a seventh transistor group and an eighth transistor group, wherein the seventh transistor group and the eighth transistor group are configured to select the source line of the second memory area, and
the sixth selection circuit selects the fifth transistor group and the seventh transistor group, or the sixth transistor group and eighth transistor group.

7. The semiconductor storage device of claim 6, wherein, when the bit line and the source line of the second memory area are selected, the semiconductor storage device causes the first selection circuit and the fourth selection circuit to perform a non-selection operation, and causes the second selection circuit, the third selection circuit, the fifth selection circuit and the sixth selection circuit to perform a selection operation.

8. The semiconductor storage device of claim 6, wherein:
the fifth transistor group and the sixth transistor group are coupled with a common third control signal line set,
the seventh transistor group and the eighth transistor group are coupled with a common fourth control signal line set,
the third control signal line set includes a plurality of control signal lines commonly coupled to a control gate electrode of one transistor of the fifth transistor group and a control gate electrode of one transistor of the sixth transistor group, and
the fourth control signal line set includes a plurality of control signal lines commonly coupled to a control gate electrode of one transistor of the seventh transistor group and a control gate electrode of one transistor of the eighth transistor group.

9. The semiconductor storage device of claim 8, wherein the sixth selection circuit electrically connects a global source line to the fifth transistor group and the seventh transistor group or to the sixth transistor group and eighth transistor group, based on the control signal lines.

10. A semiconductor storage device comprising:
a first memory area;
a first selection circuit which selects a bit line of the first memory area, the bit line of the first memory area extending in a first direction;
a second memory area;
a second selection circuit which selects a bit line of the second memory area, the bit line of the second memory area extending in the first direction;
a third selection circuit arranged between the first selection circuit and the second selection circuit, and configured to select the first selection circuit or the second selection circuit;
a fourth selection circuit arranged between the first selection circuit and the third selection circuit, and
a fifth selection circuit arranged between the second selection circuit and the third selection circuit,
wherein:
the first memory area, the first selection circuit, the third selection circuit, the second selection circuit, and the second memory area are aligned in this order in the first direction,
the first selection circuit comprises at least a first transistor group, a second transistor group, a third transistor group and a fourth transistor group, wherein the first transistor group, the second transistor group, the third transistor group and the fourth transistor group are configured to select the bit line of the first memory area,
the fourth selection circuit comprises at least a fifth transistor group and a sixth transistor group, wherein the fifth transistor group is configured to select either the first transistor group or the second transistor group, and the sixth transistor group is configured to select either the third transistor group or the fourth transistor group,
the second selection circuit comprises at least a seventh transistor group, an eighth transistor group, a ninth transistor group and a tenth transistor group, wherein the seventh transistor group, the eighth transistor group, the ninth transistor group and the tenth transistor group are configured to select the bit line of the second memory area, the fifth selection circuit comprises at least an eleventh transistor group and a twelfth transistor group, wherein the eleventh transistor group is configured to select either the seventh transistor group or the eighth transistor group, and the twelfth transistor group is configured to select either the ninth transistor group or the tenth transistor group, and the third selection circuit selects the fifth transistor group and the eleventh transistor group, or the sixth transistor group and the twelfth transistor group.

11. The semiconductor storage device of claim 10, wherein, when the bit line of the second memory area is selected, the semiconductor storage device causes the first selection circuit and the fourth selection circuit to perform a non-selection operation, and causes the third selection circuit, the second selection circuit and the fifth selection circuit to perform a selection operation.

12. The semiconductor storage device of claim 10, wherein:
the first transistor group, the second transistor group, the third transistor group and the fourth transistor group are coupled with a common first control signal line set, and
the seventh transistor group, the eighth transistor group, the ninth transistor group and the tenth transistor group are coupled with a common second control signal line set.

13. The semiconductor storage device of claim 10, wherein the third selection circuit electrically connects a global bit line to the fifth transistor group and the eleventh transistor group or to the sixth transistor group and twelfth transistor group, based on control signal lines.

14. The semiconductor storage device of claim 10, further comprising:
a third memory area;
a sixth selection circuit which selects a source line of the third memory area;
a seventh selection circuit which selects a source line of the second memory area;
a eighth selection circuit arranged between the sixth selection circuit and the seventh selection circuit;
a ninth selection circuit arranged between the sixth selection circuit and the eighth selection circuit; and
a tenth selection circuit arranged between the seventh selection circuit and the eighth selection circuit.

15. A semiconductor storage device comprising:
a first memory area;
a first selection circuit which selects a bit line of the first memory area, the bit line of the first memory area extending in a first direction;
a second memory area;
a second selection circuit which selects a bit line of the second memory area, the bit line of the second memory area extending in the first direction; and a third selection circuit arranged between the first selection circuit and the second selection circuit, and configured to select the first selection circuit or the second selection circuit, wherein:
the first selection circuit is connected to the third selection circuit without crossing the second selection circuit and the second selection circuit is connected to the third selection circuit without crossing the first selection circuit, the first selection circuit includes at least a first transistor group and a second transistor group, wherein the first transistor group and the second transistor group are configured to select the bit line of the first memory area, the second selection circuit includes at least a third transistor group and a fourth transistor group, wherein the third transistor group and the fourth transistor group are configured to select the bit line of the second memory area, and the third selection circuit selects the first transistor group and the third transistor group, or the second transistor group and fourth transistor group.

16. The semiconductor storage device of claim 15, wherein, when the bit line of the second memory area is selected, the semiconductor storage device causes the first selection circuit to perform a non-selection operation, and causes the second selection circuit and the third selection circuit to perform a selection operation.

17. The semiconductor storage device of claim 15, wherein:
at least the first transistor group and the second transistor group are coupled with a common first control signal line set,
at least the third transistor group and the fourth transistor group are coupled with a common second control signal line set,
the first control signal line set includes a plurality of control signal lines commonly coupled to a plurality of transistors of the first transistor group and the second transistor group, and
the second control signal line set includes a plurality of control signal lines commonly coupled to a plurality of transistors of the third transistor group and the fourth transistor group.

18. The semiconductor storage device of claim 17, wherein the third selection circuit electrically connects a global bit line to the first transistor group and the third transistor group or to the second transistor group and fourth transistor group, based on the control signal lines.

* * * * *